US012633933B2

(12) United States Patent
Lee et al.

(10) Patent No.: US 12,633,933 B2
(45) Date of Patent: May 19, 2026

(54) PHASE-LOCKED LOOP CIRCUIT, PHASE ERROR SIGN GENERATOR AND RFIC

(71) Applicant: SAMSUNG ELECTRONICS CO., LTD., Suwon-si (KR)

(72) Inventors: Minseob Lee, Suwon-si (KR); Sangmin Yoo, Suwon-si (KR); Joonhee Lee, Suwon-si (KR); Ikkyun Jo, Suwon-si (KR); Honggul Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 96 days.

(21) Appl. No.: 18/808,348

(22) Filed: Aug. 19, 2024

(65) Prior Publication Data

US 2025/0070790 A1 Feb. 27, 2025

(30) Foreign Application Priority Data

Aug. 22, 2023 (KR) ........................ 10-2023-0110036
Mar. 11, 2024 (KR) ........................ 10-2024-0034078

(51) Int. Cl.
$H03L\ 7/197$ (2006.01)
$H03L\ 7/097$ (2006.01)
$H03L\ 7/099$ (2006.01)

(52) U.S. Cl.
CPC ............ $H03L\ 7/1976$ (2013.01); $H03L\ 7/097$ (2013.01); $H03L\ 7/099$ (2013.01)

(58) Field of Classification Search
CPC ....... H03L 7/1976; H03L 7/097; H03L 7/099; H03L 7/087
See application file for complete search history.

(56) References Cited

U.S. PATENT DOCUMENTS 9,461,653 B2   10/2016   Perrott
10,200,047 B2   2/2019   Markulic et al.
10,581,418 B2 *   3/2020   Wu ........................ H03L 7/097
(Continued)

OTHER PUBLICATIONS

Wu, et al. "A 28-nm 75-fsrms Analog Fractional-N Sampling PLL With a Highly Linear DTC Incorporating Background DTC Gain Calibration and Reference Clock Duty Cycle Correction", IEEE Journal of Solid-State Circuits, vol. 54, No. 5, May 2019, pp. 1254-1265.

(Continued)

*Primary Examiner* — Menatoallah Youssef
*Assistant Examiner* — Colleen J O Toole
(74) *Attorney, Agent, or Firm* — Morgan, Lewis & Bockius LLP

(57) ABSTRACT

A phase-locked loop (PLL) circuit includes a voltage-controlled oscillator configured to generate an output clock signal of the PLL circuit, a phase detector configured to generate a phase error signal representing a phase difference between a first clock signal based on a reference clock signal and a second clock signal based on the output clock signal, a comparator configured to generate a phase error sign signal based on a reference voltage and the phase error signal, and a reference voltage generation circuit configured to scale first and second sign values of the phase error sign signal based on a fixed gain value and a variable gain value, respectively, and generate the reference voltage based on the scaled first and second sign values.

20 Claims, 19 Drawing Sheets

100

700

(56)             References Cited

U.S. PATENT DOCUMENTS

| | | |
|---|---|---|
| 10,917,078 B2 | 2/2021 | Wu et al. |
| 10,965,297 B1 | 3/2021 | Wu et al. |
| 11,175,633 B2 | 11/2021 | Yao et al. |
| 11,632,116 B2 | 4/2023 | Perrott |
| 11,658,667 B2 | 5/2023 | J et al. |
| 11,716,087 B1 | 8/2023 | Bhat et al. |
| 2019/0214976 A1 | 7/2019 | Wu et al. |
| 2023/0098856 A1 | 3/2023 | Kundu et al. |

OTHER PUBLICATIONS

EPO Search Report dated Jan. 23, 2025 from the EPO in respect of the EP Patent Application No. 24194721.7, 11 pages.
Wu, et al. "A 5.5-7.3 GHZ Analog Fractional-N Sampling PLL in 28-nm CMOS with 75 fsrms Jitter and -249.7 dB FoM", 2018 IEEE Radio Frequency Integrated Circuits Symposium, pp. 52-55.

\* cited by examiner

PHASE-LOCKED LOOP CIRCUIT, PHASE ERROR SIGN GENERATOR AND RFIC

CROSS-REFERENCE TO RELATED APPLICATION(S)

This U.S. non-provisional application claims priority under 35 USC § 119 to Korean Patent Application Nos. 10-2023-0110036, filed on Aug. 22, 2023 and 10-2024-0034078, filed on Mar. 11, 2024, in the Korean Intellectual Property Office, the disclosures of which are herein incorporated by reference in their entirety.

TECHNICAL FIELD

Example embodiments relate to a phase-locked loop circuit, a phase error sign generator, and a radio-frequency integrated circuit (RFIC).

DISCUSSION OF RELATED ART

In a wireless communication system, an RFIC may serve to convert a baseband signal into an RF signal or vice versa. To this end, the RFIC may include a local oscillator (LO).

A fractional-N phase-locked loop (PLL) used in a local oscillator inherently has fractional spurs, which degrade integrated phase noise (IPN) characteristics of the local oscillator. For example, a digital-to-time converter (DTC) is a delay generator that converts a number to a time delay. In a DTC-based fractional-N PLL, nonlinearity or the like of a DTC may cause an increase in fractional spurs.

SUMMARY

Example embodiments provide a phase-locked loop (PLL) with reduced fractional spurs for improved performance. In addition, example embodiments provide a phase error sign generator for reducing the size of fractional spurs.

According to an example embodiment, a phase-locked loop (PLL) circuit includes a voltage-controlled oscillator configured to generate an output clock signal of the PLL circuit; a phase detector configured to generate a phase error signal representing a phase difference between a first clock signal based on a reference clock signal and a second clock signal based on the output clock signal; a comparator configured to generate a phase error sign signal based on a reference voltage and the phase error signal; and a reference voltage generation circuit configured to scale first and second sign values of the phase error sign signal based on a fixed gain value and a variable gain value, respectively, and generate the reference voltage based on the scaled first and second sign values.

The reference voltage generation circuit may adjust the variable gain value such that an average value of the first and second sign values of the phase error sign signal is zero when the PLL circuit is fixed.

The reference voltage generation circuit may include a scaling circuit configured to scale the first and second sign values of the phase error sign signal by the fixed gain value and the variable gain value, respectively, a delta-sigma modulator configured to output a 2-bit signal based on the scaled first and second sign values, and a digital-to-analog converter (DAC) configured to generate the reference voltage based on the 2-bit signal.

The DAC may be a delta-voltage DAC including an output capacitor charged, held, or discharged by one step based on the 2-bit signal and configured to output the reference voltage.

The 2-bit signal may include an up-signal to increase the reference voltage, a down-signal to decrease the reference voltage, and a hold signal to hold the reference voltage. Up-current flowing through the output capacitor based on the up-signal and down-current flowing through the output capacitor based on the down-signal may have different magnitudes.

The first sign value may correspond to a positive number and the second sign value may correspond to a negative number, and the delta-sigma modulator may generate the 2-bit signal based on the first sign value scaled by the variable gain value and the second sign value scaled by the fixed gain value, or vice versa.

The reference voltage generation circuit may increase the variable gain value when the down-current is larger than the up-current and decrease the variable gain value when the up-current is larger than the down-current.

The reference voltage generation circuit may decrease the variable gain value when the down-current is larger than the up-current and increase the variable gain value when the up-current is larger than the down-current.

The reference voltage generation circuit may adjust the variable gain value based on an integral value of the phase error sign signal.

The scaling circuit may include a multiplexer configured to output a first constant corresponding to the first sign value and a second constant corresponding to the second sign value based on two code values of the phase error sign signal, an integrator configured to integrate an output of the multiplexer, and a quantizer configured to quantize the integral value of the integrator to generate the variable gain value. The first and second constants may have the same absolute value less than 1 but with opposite signs.

The PLL circuit may include a digital-to-time converter (DTC) configured to delay the reference clock signal based on a DTC code, a control code generation circuit configured to generate a division ratio code and the DTC code based on a frequency control word (FCW) and the phase error sign signal, and a divider configured to generate a feedback clock signal based on the division ratio code and the output clock signal. The first clock signal may be the reference clock signal delayed by the DTC, and the second clock signal may be the feedback clock signal.

The control code generation circuit may include a delta-sigma modulator configured to generate the division ratio code based on the FCW, an integrator configured to integrate a difference between the division ratio code and the FCW to generate a phase error code, and a DTC calibration circuit configured to generate the DTC code based on the phase error code and the phase error sign signal.

The DTC calibration circuit may include a DTC nonlinearity calibration circuit configured to generate an offset value for calibrating nonlinearity of the DTC based on the phase error sign signal and the phase error code.

The DTC calibration circuit may include a DTC gain calibration circuit configured to generate a DTC gain value for scaling the phase error code based on the phase error sign signal and the phase error code.

The PLL circuit may include a transconductance circuit configured to convert the phase error signal, which is a sampled voltage signal, into a current signal and a loop filter configured to convert the converted current signal into a voltage signal for controlling an operation of the voltage-controlled oscillator. The reference voltage generation circuit may generate the reference voltage such that a threshold voltage of the comparator tracks a threshold voltage of the transconductance circuit when the PLL circuit is in a locked state.

According to an example embodiment, a phase error sign generator includes a comparator configured to generate a phase error sign signal based on a reference voltage and a phase error signal and a reference voltage generation circuit configured to scale first and second sign values of the phase error sign signal based on a fixed gain value and a variable gain value, respectively, and generate the reference voltage based on the scaled first and second sign values.

The reference voltage generation circuit may adjust the variable gain value such that an average value of the first and second sign values of the phase error sign signal is zero.

The phase error signal may be an output signal of a sampling phase detector within a phase-locked loop (PLL).

According to an example embodiment, a radio-frequency integrated circuit (RFIC) includes a mixer and a local oscillator configured to provide a reference frequency source to the mixer. The local oscillator includes a voltage-controlled oscillator configured to generate an output clock signal, a phase detector configured to generate a phase error signal representing a phase difference between a first clock signal based on a reference clock signal and a second clock signal based on the output clock signal, a comparator configured to generate a phase error sign signal based on a reference voltage and the phase error signal, and a reference voltage generation circuit configured to scale first and second sign values of the phase error sign signal based on a fixed gain value and a variable gain value, respectively, and generates the reference voltage based on the scaled first and second sign values.

The RFIC may further include circuitry for adjusting timing of the first clock signal based on the phase error sign signal.

BRIEF DESCRIPTION OF DRAWINGS

The above and other aspects, features, and advantages of the present disclosure will be more clearly understood from the following detailed description, taken in conjunction with the accompanying drawings.

FIG. 10 is a block diagram illustrating an example of implementing the phase error sign generator of FIG. 7A.

DETAILED DESCRIPTION

Hereinafter, example embodiments will be described with reference to the accompanying drawings.

Herein, for brevity, signals such as voltages or currents, once introduced by a name and a legend, may be thereafter referred to by just their legend or an abbreviated name followed by the legend. For instance, a "phase error sign signal PHE_SIGN" may be subsequently referred to as just "PHE_SIGN" or "signal PHE_SIGN").

Figure 1:
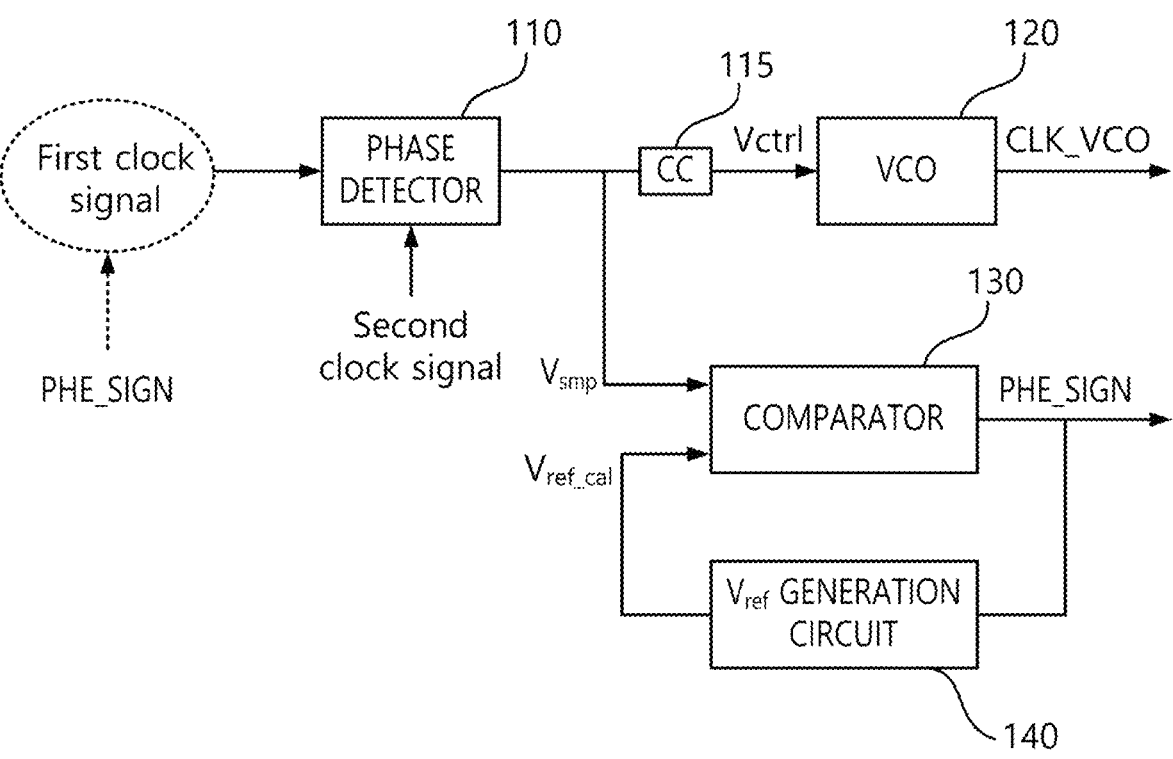
FIG. 1 is a block diagram of a phase-locked loop (PLL) circuit according to an example embodiment.

FIG. 1 is a block diagram of a phase-locked loop (PLL) circuit according to an example embodiment. Referring to FIG. 1, a PLL circuit 100 may include a phase detector 110, a control circuit ("CC") 115, a voltage-controlled oscillator (VCO) 120, a comparator 130, and a reference voltage generation circuit 140.

The VCO 120 may generate an output clock signal CLK_VCO of the PLL circuit 100 based on a control voltage Vctrl. The control voltage Vctrl may be generated by the control circuit 115, which may include a loop filter (e.g., 190 of FIG. 2). The control voltage Vctrl may be based on an output signal of the phase detector 110, e.g., a phase error signal $V_{smp}$.

The phase detector 110 may generate the phase error signal $V_{smp}$ representing a phase difference between a first clock signal and a second clock signal. The first clock signal may be generated based on a reference clock signal CLK_REF. For example, the first clock signal may be a reference clock signal CLK_REF delayed by a digital-to-time converter (DTC) (e.g., 150 of FIG. 2). The second clock signal may be generated based on the output clock signal CLK_VCO. For example, the second clock signal may be a feedback clock signal CLK_FB (see FIG. 2) generated by a feedback divider (e.g., 170 of FIG. 2), based on the output clock signal CLK_VCO. The phase error signal $V_{smp}$ may represent a phase error between the first clock signal and the second clock signal.

The comparator 130 may generate a phase error sign signal PHE_SIGN based on the phase error signal $V_{smp}$ and the reference voltage $V_{ref\_cal}$. The signal PHE_SIGN may be a signal representing a relationship in terms of magnitude between a voltage of the phase error signal $V_{smp}$ and the reference voltage $V_{ref\_cal}$. For example, PHE_SIGN may have a voltage value corresponding to '+1' when the voltage of the phase error signal $V_{smp}$ is higher than the reference voltage $V_{ref\_cal}$. In addition, PHE_SIGN may have a voltage value corresponding to '−1' when the voltage of the phase error signal $V_{smp}$ is lower than the reference voltage $V_{ref\_cal}$. The signal PHE_SIGN may represent sign information (a positive sign or a negative sign) of a phase error between a first clock signal and a second clock signal. As illustrated by the dashed lines in FIG. 1, the signal PHE_SIGN may be used for dynamically adjusting the timing (e.g., the delay) of the first clock signal applied to the phase detector 110. Details on exemplary ways of adjusting the timing of the first clock signal are described below.

The phase error sign signal PHE_SIGN may be used to reduce fractional spurs of the PLL circuit 100. For example, when the PLL circuit 100 is a DTC-based fractional-N PLL circuit, PHE_SIGN may be used to calibrate a DTC code controlling an amount of delay of a DTC (e.g., DTC 150 of FIG. 2). The fractional spurs of the PLL circuit 100 may be reduced through accurate calibration of the DTC code.

When the PLL circuit 100 is locked, there is negligible or zero phase difference between the first clock signal and the second clock signal. Therefore, a mean or average of PHE_SIGN should be 0. (Herein, when a signal is said to have a mean or average of a target value (e.g., zero), the target value should be understood to be within a certain tolerance range of the stated value). If an inaccurate phase error sign signal PHE_SIGN were to be generated in the locked state of the PLL circuit 100 (e.g., when the mean of PHE_SIGN is not zero in the locked state of the PLL circuit 100), the accuracy of the DTC code calibration may be reduced, which may lead to an increase in the fractional spurs of the PLL circuit 100 and a worsening of integrated phase noise (IPN).

To prevent/reduce such fractional spurs, the reference voltage generation circuit 140 may generate a reference voltage $V_{ref\_cal}$ based on PHE_SIGN and provide the generated $V_{ref\_cal}$ to the comparator 130. For example, the reference voltage generation circuit 140 may dynamically adjust $V_{ref\_cal}$ based on PHE_SIGN such that the comparator 130 generates an accurate signal PHE_SIGN.

The reference voltage generation circuit 140 may include a delta-voltage digital-to-analog converter (DAC). The delta-voltage DAC may have a simple structure in which current flowing through an output capacitor is symmetrically adjusted based on "up" and "down" signals to adjust a reference voltage. The delta-voltage DAC has a significantly simpler structure than a general DAC, so that an area overhead and design complexity may be reduced when a PLL circuit is designed.

The delta-voltage DAC structure may have a mismatch between "up-current" flowing through an output capacitor in a first direction based on an "up-signal", and "down-current" flowing through the output capacitor in an opposite direction based on a "down-signal". For example, magnitudes of the up-current and the down-current in the delta-voltage DAC structure may be ideally the same, but in practice there may be a difference therebetween due to issues in implementation (e.g., manufacturing tolerances). Without the remedial measures described herein, even when the reference voltage generation circuit 140 operates accurately, an accurate signal PHE SIGN may not be generated due to the mismatch between the up-current and the down-current.

The reference voltage generation circuit 140 may alleviate/resolve this problem by scaling two (first and second) sign values of PHE_SIGN based on a fixed gain value and a variable gain value, respectively, and generate a reference voltage $V_{ref\_cal}$ based on the scaled first and second sign values. The variable gain value may be adjusted to generate an accurate signal PHE SIGN even when a mismatch exists between up-current and down-current caused by the delta-voltage DAC structure.

According to the above-described embodiments, an accurate phase error sign signal PHE SIGN may be generated. Accordingly, the fractional spurs of the PLL circuit 100 may be reduced.

Figure 2:
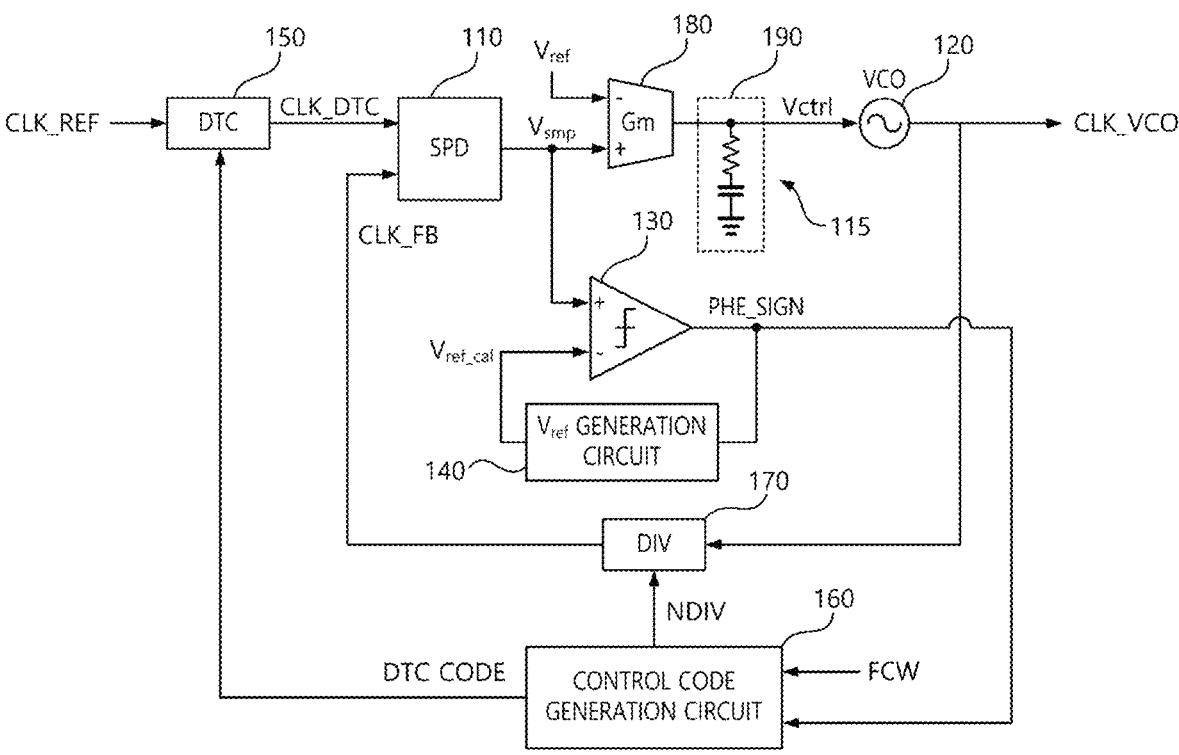
FIG. 2 is a block diagram of a fractional-N PLL circuit according to an example embodiment.

FIG. 2 is a block diagram of a fractional-N PLL circuit according to an example embodiment. A fractional-N PLL circuit 100A may be an example of implementing the PLL circuit 100 of FIG. 1. Also, the fractional-N PLL circuit 100A may be a DTC-based analog sampling PLL.

The fractional-N PLL circuit 100A may include a phase detector 110, a VCO 120, a comparator 130, a reference voltage generation circuit 140, a digital-to-time converter (DTC) 150, a control code generation circuit 160, a divider 170, a transconductance ("Gm") circuit 180, and a loop filter 190. The Gm circuit 180 and loop filter 190 together constitute an example of the control circuit 115 of FIG. 1.

The control code generation circuit 160 may generate a division ratio code NDIV and the DTC code based on a frequency control word (FCW) provided from an external source such as a controller of a device within which the PLL circuit 100A is included. To this end, the control code generation circuit 160 may include a delta-sigma modulator. The generated division ratio code NDIV and DTC code may be provided to the divider 170 and the DTC 150, respectively.

The divider 170 may generate a feedback clock signal CLK_FB from an output clock signal CLK_VCO based on the division ratio code NDIV. The divider 170 may be disposed in a path along which the output clock signal CLK_VCO is fed back to the phase detector 110. Therefore, the divider 170 may be referred to as a feedback divider. The divider 170 may be a multi-modulus divider (MMDIV). The feedback clock signal CLK_FB may be provided to the phase detector 110.

The DTC 150 may delay the reference clock signal CLK_REF based on the DTC code. Quantization noise, introduced by the delta-sigma modulator of the control code generation circuit 160, may be removed by an appropriate amount of delay introduced by DTC 150. The DTC output signal CLK_DTC (for example, the reference clock signal CLK_REF delayed by the DTC 150) may be provided to the phase detector 110. FIG. 2 illustrates the case in which the DTC 150 delays the reference clock signal CLK_REF. In another embodiment, CLK_FB is also applied to the DTC 150, and the DTC 150 delays CLK_FB to remove quantization noise.

The phase detector 110 may generate a phase error signal $V_{smp}$ representing a phase difference between the DTC output signal CLK_DTC and the feedback clock signal CLK_FB. The phase error signal $V_{smp}$ may be a sampled voltage signal representing this phase difference. The phase detector 110 may be a sampling phase detector SPD including a ramp voltage generator and a sampling circuit. The ramp voltage generator may generate a ramp voltage based on the DTC output signal CLK_DTC. The sampling circuit may sample the ramp voltage based on the feedback clock signal CLK_FB. The sampled ramp voltage may be the phase error signal $V_{smp}$. The generated phase error signal $V_{smp}$ may be provided to the Gm circuit 180 and the comparator 130.

The Gm circuit 180 may convert a difference between the phase error signal $V_{smp}$ and a reference signal $V_{ref}$ into a current signal. For example, the Gm circuit 180 may generate a current signal corresponding to a difference between the phase error signal $V_{smp}$ and the reference voltage $V_{ref}$, and provide the generated current signal to the loop filter 190.

The loop filter 190 may generate a control voltage $V_{ctrl}$ corresponding to the current signal provided by the Gm circuit 180. The loop filter 190 may be an analog low-pass filter. The loop filter 190 may filter the received current signal to generate and output a control voltage $V_{ctrl}$ to the VCO 120 for controlling a frequency of the VCO 120.

The VCO 120 may generate an output clock signal CLK_VCO based on the control voltage $V_{ctrl}$. A frequency of the output clock signal CLK_VCO may vary depending on the magnitude of the control voltage $V_{ctrl}$. The output clock signal CLK_VCO may be fed back to the phase detector 110 through the divider 170.

The comparator 130 may generate an error signal to calibrate the DTC code. A basic method for calibrating the DTC code is least mean square (LMS) regression. The present method uses an error signal of a subject to be calibrated. A difference between the phase error signal $V_{smp}$, which is an output signal of the phase detector 110, and the reference voltage $V_{ref}$ of the Gm circuit 180 may be used as an error signal. According to an example embodiment, the comparator 130 may be used to obtain a sign of the error signal. The comparator 130 may compare $V_{smp}$ with $V_{ref\_cal}$ and output a phase error sign signal PHE_SIGN representing the sign (a positive sign or a negative sign) of ($V_{smp}$ minus $V_{ref\_cal}$) or vice versa.

For example, when the fractional-N PLL circuit 100A is locked, average output current of the Gm circuit 180 may be about 0. The phase error signal $V_{smp}$ may have the same voltage as the reference voltage $V_{ref}$ of the Gm circuit 180. Accordingly, a sign of the phase error signal $V_{smp}$ may be obtained using the same voltage as the reference voltage $V_{ref}$ of the Gm circuit 180 as a reference voltage of the comparator 130. However, this is a result obtained in an ideal case. In practice, there may be a difference between the magnitude of an input offset voltage of the Gm circuit 180 and the magnitude of an input offset voltage of the comparator 130. Accordingly, when the same voltage as the reference voltage $V_{ref}$ of the Gm circuit 180 is used as the reference voltage of the comparator 130, the comparator 130 may not output an accurate phase error sign signal PHE_SIGN.

According to an example embodiment, a reference voltage $V_{ref\_cal}$ separate from the reference voltage $V_{ref}$ of the Gm circuit 180 may be generated based on the phase error sign signal PHE_SIGN, and the generated reference voltage $V_{ref\_cal}$ may be provided to the comparator 130. For example, the reference voltage generation circuit 140 may dynamically adjust the reference voltage $V_{ref\_cal}$ based on the phase error sign signal PHE_SIGN such that the threshold voltage of the comparator 130 matches the threshold voltage of the Gm circuit 180, and may provide the adjusted reference voltage $V_{ref\_cal}$ to the comparator 130. Accordingly, the comparator 130 may generate an accurate phase error sign signal PHE_SIGN. The signal PHE_SIGN may also be output to the control code generation circuit 160, which may generate and calibrate the DTC code based on PHE_SIGN. As mentioned above, the DTC code may be applied to the DTC 150 to control an amount of delay of the DTC 150 and thereby dynamically adjust a delay of the first clock signal CLK_DTC.

Figure 3:
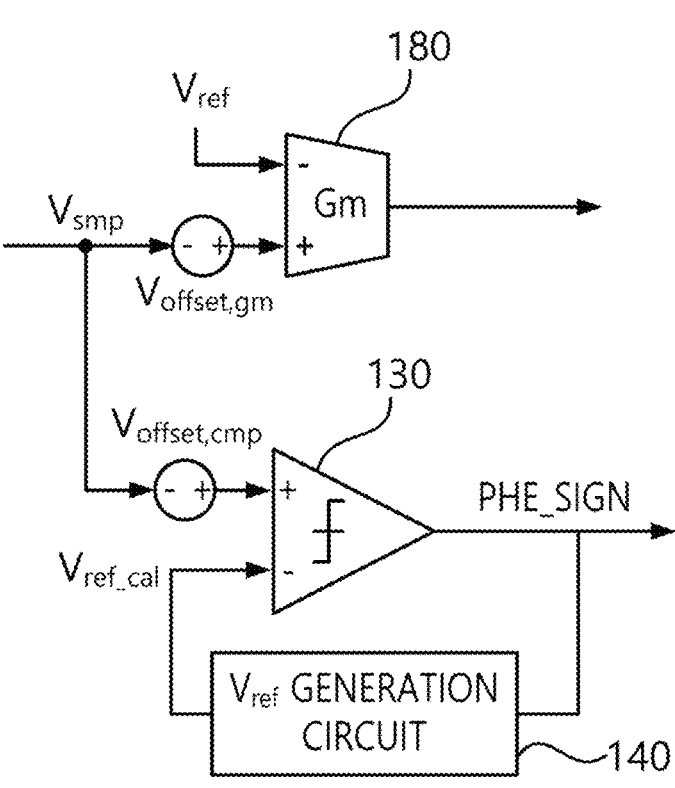
FIG. 3 is a diagram illustrating the operation of a reference voltage generation circuit according to an example embodiment.

FIG. 3 is a diagram illustrating the operation of a reference voltage generation circuit according to an example embodiment. When the PLL circuit 100 or 100A is locked, the average output current of the Gm circuit 180 may be 0. Accordingly, in an ideal case in which there is no input offset voltage of the Gm circuit 180 and the comparator 130, $V_{smp}=V_{ref}$. In an example embodiment, an accurate phase error sign signal PHE_SIGN, for example, a phase error sign signal PHE_SIGN having an average value of 0, may be obtained through the comparator 130 having the threshold voltage of $V_{ref}$.

However, in practice, the Gm circuit 180 and comparator 130 may have offset voltages of different magnitudes such as $V_{offset,gm}$ and $V_{offset,cmp}$ illustrated in FIG. 3. The comparator 130 having the threshold voltage of $V_{ref}$ may output '+1' or '−1' depending on which input offset voltage is larger. For example, if $V_{ref\_cal}$ is not optimally set, the comparator 130 may not output a phase error sign signal PHE_SIGN having an average of 0 even when the PLL circuit 100 or 100A is locked.

In an example embodiment, the threshold voltage of the comparator 130 and the threshold voltage of the Gm circuit 180 should be the same to generate a phase error sign signal PHE_SIGN having an average of 0. To this end, according to an example embodiment, the reference voltage generation circuit 140 may dynamically adjust the reference voltage $V_{ref\_cal}$.

For example, referring to FIG. 3, the average output current of the Gm circuit 180 is 0 when the PLL circuit 100 or 100A is locked, so that the equation $V_{smp}+V_{offset,gm}=V_{ref}$ is true. Accordingly, the threshold voltage of the Gm circuit 180 may be $V_{ref}-V_{offset,gm}$. PHE_SIGN may have an average value of 0 when the PLL circuit 100 or 100A is locked, so that the equation $V_{smp}+V_{offset,cmp}=V_{ref\_cal}$ should be true. Accordingly, the threshold voltage of the comparator 130 may be $V_{ref\_cal}-V_{offset,cmp}$. When the threshold voltage of the Gm circuit 180 and the threshold voltage of the comparator 130 are effectively the same, the equation $V_{ref}-V_{offset,gm}=V_{ref\_cal}-V_{offset,cmp}$ may be true.

Accordingly, the reference voltage generation circuit 140 may generate a reference voltage $V_{ref\_cal}$ having a value of $V_{ref}-V_{offset,gm}+V_{offset,cmp}$ when the PLL circuit 100 or 100A is locked, and may output the generated reference voltage $V_{ref\_cal}$ to the comparator 130. In an example embodiment, the threshold voltage of the comparator 130 and the threshold voltage of the Gm circuit 180 may be the same, and the comparator 130 may output an accurate phase error sign signal PHE_SIGN having an average value of 0.

Figure 4:
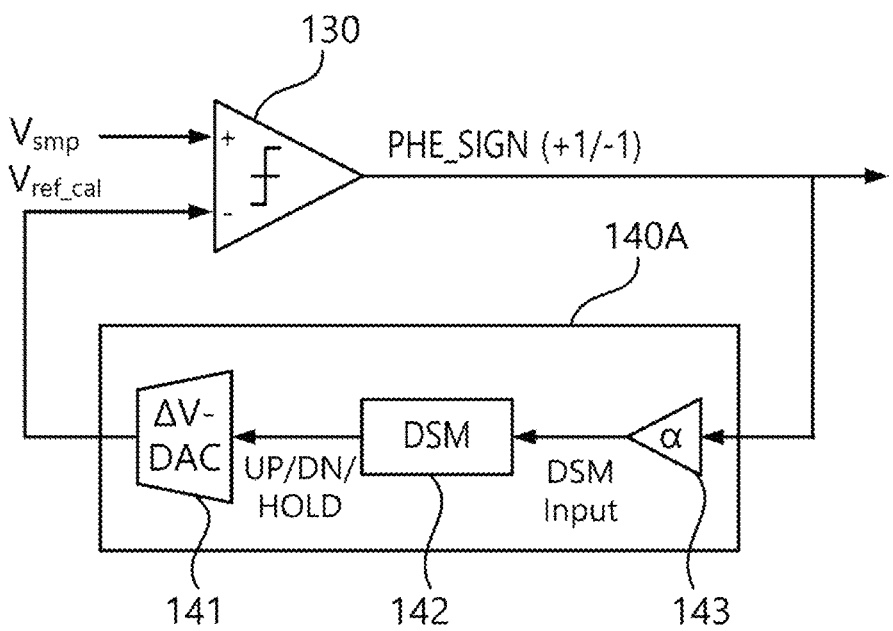
FIG. 4 is a block diagram of a phase error sign generator according to an example embodiment.

FIG. 4 is a block diagram of a phase error sign generator according to an example embodiment. A phase error sign generator 400 may constitute a portion of the PLL circuits 100, 100A, or 100B of FIG. 1, 2, or 13, but example embodiments are not limited thereto. Referring to FIG. 4, the phase error sign generator 400 may include a comparator 130 and a reference voltage generation circuit 140A.

The comparator 130 may generate a phase error sign signal PHE_SIGN based on a reference voltage $V_{ref\_cal}$ and a phase error signal $V_{smp}$. In an example embodiment, $V_{smp}$ may be an output signal of a sampling phase detector 110 within a PLL, but example embodiments are not limited thereto.

The reference voltage generation circuit 140A may generate a reference voltage $V_{ref\_cal}$ based on PHE_SIGN and provide the generated reference voltage $V_{ref\_cal}$ to the comparator 130. According to an example embodiment, the reference voltage generation circuit 140A may include a delta-voltage DAC 141, a delta-sigma modulator 142, and a scaling circuit 143.

Referring to FIG. 4, an input of the reference voltage generation circuit 140A may be the phase error sign signal PHE_SIGN output from the comparator 130. The scaling circuit 143 may scale PHE_SIGN based on a gain value (or a scaling factor) $\alpha$. The gain value $\alpha$ may be a positive number less than 1.

The signal PHE_SIGN scaled by the scaling circuit 143 may be input to the delta-sigma modulator 142, and may be converted into a 2-bit up, down, or hold signal UP, DN, or HOLD by the delta-sigma modulator 142. During the conversion, the resolution of the delta voltage-DAC 141 may be relaxed. In an example embodiment, the delta-sigma modulator 142 may be a first-order delta-sigma modulator. Even when the first-order delta-sigma modulator is used, the resolution of the delta voltage-DAC 141 may be sufficiently relaxed. In other embodiments, a second or higher-order delta-sigma modulator may be used.

The delta-voltage DAC 141 may generate a reference voltage $V_{ref\_cal}$ based on the 2-bit up, down, or hold signal UP, DN, or HOLD provided by the delta-sigma modulator 142 and output the generated $V_{ref\_cal}$ to the comparator 130. The delta-voltage DAC may have a significantly simpler structure than a general DAC and reduce area overhead and design complexity when the PLL circuit is designed.

Figure 5:
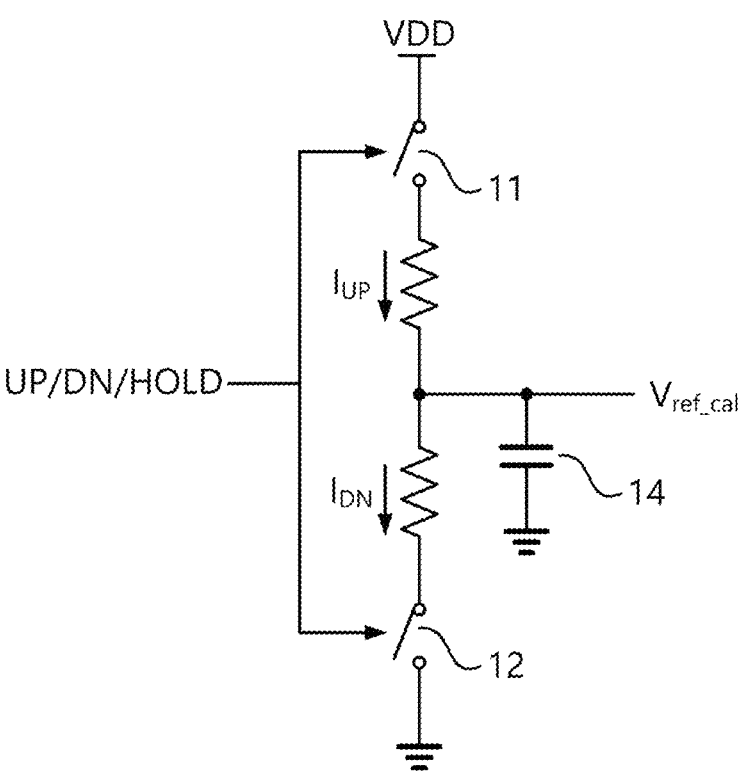
FIG. 5 is a schematic circuit diagram illustrating the configuration of a delta-voltage digital-to-analog converter (DAC) according to an example embodiment.

FIG. 5 is a schematic circuit diagram illustrating the configuration of a delta-voltage DAC according to an example embodiment. Referring to FIG. 5, a delta-voltage DAC 141 may include an output capacitor 14 performing one-step charging, discharging, or holding operation based on the 2-bit up, down, or hold signal UP, DN, or HOLD applied from the delta-sigma modulator 142 and outputting a reference voltage $V_{ref\_cal}$. For example, when an up-signal UP is applied, an up-switch 11 connected to a driving voltage VDD may be turned on and a down-switch 12 connected to ground may be turned off. In an example embodiment, up-current IUP may flow through an output capacitor 14 through the turned-on up-switch 11. Accordingly, the output capacitor 14 may be charged and the reference voltage $V_{ref\_cal}$ may increase. When a down-signal DN is applied, the up-switch 11 is turned off and the down-switch 12 is turned on. The down-current IDN may flow through the output capacitor 14 through the turned-on down-switch 12. Accordingly, the output capacitor 14 is discharged and the reference voltage $V_{ref\_cal}$ may decrease. When a hold signal HOLD is applied, both switches 11, 12 may be turned off. In an example embodiment, no current may flow through the output capacitor 14, and the reference voltage $V_{ref\_cal}$ may be held.

Figure 6A:
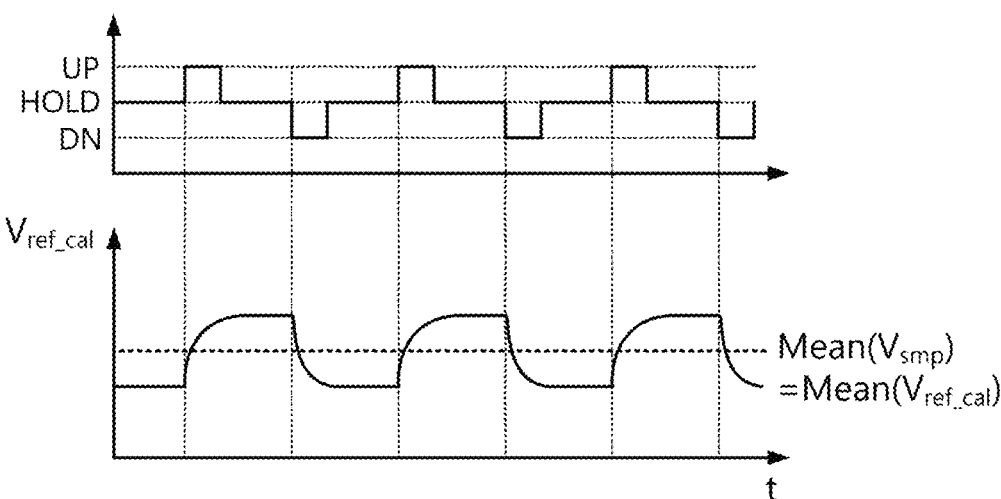
FIG. 6A is a diagram illustrating a mismatch issue of up-current and down-current of a delta-voltage DAC.
Figure 6B:
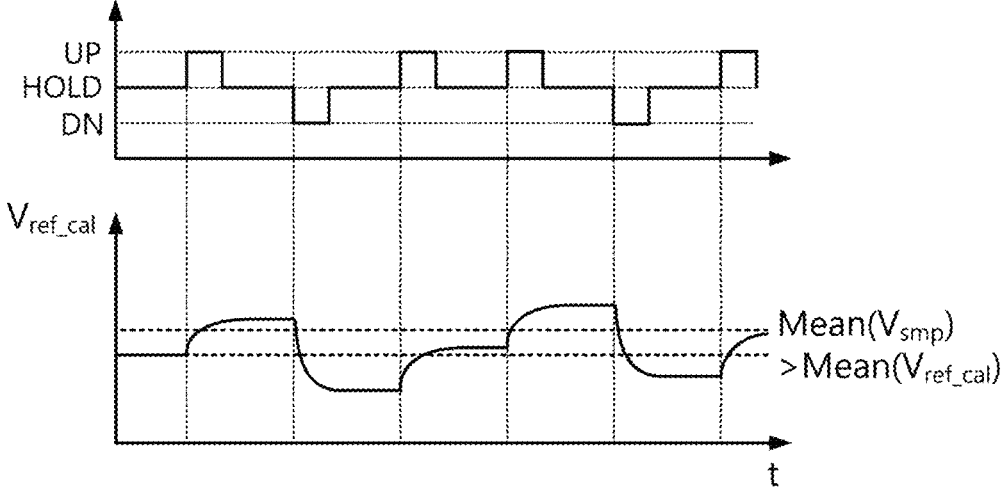
FIG. 6B is a diagram illustrating a mismatch issue of up-current and down-current of a delta-voltage DAC.

FIGS. 6A and 6B are diagrams illustrating a mismatch between up-current and down-current of a delta-voltage DAC. FIGS. 6A and 6B illustrate changes in the up, down, or hold signal UP, DN, or HOLD output by the delta-sigma modulator 142 and the reference voltage $V_{ref\_cal}$ output by the delta-voltage DAC 141 when the PLL circuit 100 or 100A is locked. FIG. 6A illustrates the case in which magnitudes of the up-current IUP and the down-current IDN of the delta-voltage DAC 141 are the same, and FIG. 6B illustrates the case in which the magnitudes of the up-current IUP and the down-current IDN of the delta-voltage DAC 141 are different from each other.

Referring to FIGS. 4, 5, and 6A, when the magnitudes of the up-current IUP and down-current IDN are the same, the delta-sigma modulator 142 may output the up-signal UP and down-signal DN in a ratio of 1:1. In an example embodiment, an average value of a signal DSM input, input to the delta-sigma modulator 142, may be 0 and an average value of the phase error sign signal PHE_SIGN may also be 0. In this state, the average value of the phase error signal $V_{smp}$ and the average value of the reference voltage $V_{ref\_cal}$ may be the same.

As described above, a delta-voltage DCA structure may encounter a mismatch issue in which the magnitudes of the up-current IUP and down-current IDN are different from each other. In a comparative example of a PLL circuit, even when the reference voltage generation circuit 140A calibrates the reference voltage $V_{ref\_cal}$, the comparator 130 may not generate an accurate phase error sign signal PHE_SIGN.

For example, when the magnitudes of the up-current IUP and down-current IDN are different from each other, the ratio of the up-signal UP and down-signal DN output by the delta-sigma modulator 142 is not 1:1, which means that an average value of the signal DSM input, input to the delta-sigma modulator 142, deviates from zero. This means that the average value of the phase error sign signal PHE_SIGN deviates from zero. In this state, the average value of the phase error signal $V_{smp}$ and the average value of the reference voltage $V_{ref\_cal}$ may be different from each other. For example, when the magnitudes of the up-current IUP and down-current IDN of the delta-voltage DAC 141 are different from each other, the comparator 130 may not generate a phase error sign signal PHE_SIGN having an average of zero even when the PLL circuit 100 or 100A is locked.

For example, FIG. 6B illustrates an example in which the down-current IDN is larger than the up-current IUP. Referring to FIGS. 4, 5, and 6B, when the down-current IDN is larger than the up-current IUP, the delta-sigma modulator 142 may output the up-signal UP more than the down-signal DN. In an example embodiment, the average value of the signal DSM input, input to the delta-sigma modulator 142, may be positive and the average value of the phase error sign signal PHE_SIGN, output by the comparator 130, may be a non-zero positive value. In an example embodiment, the average value of the reference voltage $V_{ref\_cal}$ may be smaller than the average value of the phase error signal $V_{smp}$.

As described above, when the comparator 130 does not generate an accurate phase error sign signal PHE_SIGN, the accuracy of DTC code calibration (for example, DTC gain calibration, DTC nonlinearity calibration, or the like) using PHE_SIGN may be reduced, which may lead to an increase in fractional spurs and a worsening of IPN of the PLL circuit 100 or 100A.

Figure 7A:
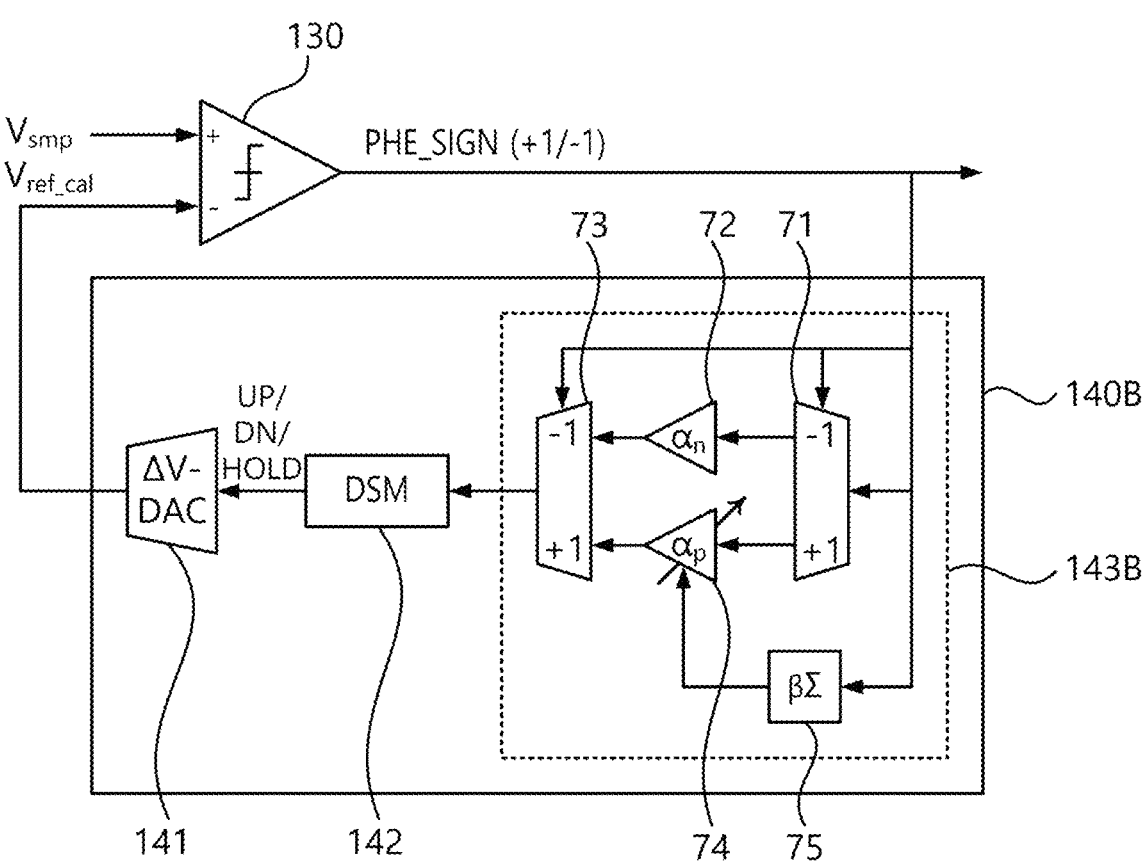
FIG. 7A is a block diagram of a phase error sign generator according to an example embodiment.

FIG. 7A is a block diagram of a phase error sign generator according to an example embodiment. A phase error sign generator 700 may constitute a portion of the PLL circuit 100, 100A, or 100B of FIG. 1, 2, or 13, but example embodiments are not limited thereto. In the description of the phase error sign generator 700, duplicate descriptions of the same components as described in FIGS. 4 and 5 will be omitted.

Referring to FIG. 7A, the phase error sign generator 700 may include a comparator 130 and a reference voltage generation circuit 140B. In an example embodiment, the reference voltage generation circuit 140B may include a delta-voltage DAC 141, a delta-sigma modulator 142, and a scaling circuit 143B.

The reference voltage generation circuit 140B may scale first and second code values '+1' and '−1' of the phase error sign signal PHE_SIGN based on a fixed gain value $\alpha_n$ and a variable gain value $\alpha_p$, respectively, and generate a reference voltage $V_{ref\_cal}$ based on the first and second code values '+1' and '−1.'

To this end, the scaling circuit 143B may include a demultiplexer 71, a fixed gain logic 72, a multiplexer 73, a variable gain logic 74, and an integrator 75.

The demultiplexer 71 may transmit the first and second code values '+1' and '−1' of the phase error sign signal PHE_SIGN to corresponding logic circuits generating gain ("gain logics"), respectively. The code value '−1' may correspond to the fixed gain logic 72, and the code value '+1' may correspond to the variable gain logic 74. The demultiplexer 71 may transmit the code values '+1' and '−1' of the received phase error sign signal PHE_SIGN to the fixed gain logic 72 and the variable gain logic 74, respectively.

The fixed gain logic 72 may scale the code value (for example, '−1') transmitted from the demultiplexer 71 by the fixed gain value $\alpha_n$ and output the scaled code value to the multiplexer 73. The variable gain logic 74 may scale the code value (e.g., '+1') transmitted from the demultiplexer 71 by the variable gain value $\alpha_p$ and output the scaled code value to the multiplexer 73. The fixed gain value an and the variable gain value $\alpha_p$ may be positive numbers less than 1, and may have different values.

The multiplexer 73 may output the value received from the fixed gain logic 72 or the variable gain logic 74 to the delta-sigma modulator 142.

As described above, when the code value '−1' is input to the scaling circuit 143B,−On may be input to the delta-sigma modulator 142. When the code value '+1' is input to the scaling circuit 143B, +$\alpha_p$ may be input to the delta-sigma modulator 142.

The integrator 75 may multiply each of the first and second code values '+1' and '−1' of the phase error sign signal PHE_SIGN by a constant $\beta$ and integrate the multiplied value. The constant $\beta$ may be a positive number less than 1. The variable gain value $\alpha_p$ may be determined based on an integral value of the integrator 75.

The delta-sigma modulator 142 may generate a 2-bit up, down, or hold signal UP, DN, or HOLD based on the output values (+$\alpha_p$ and −$\alpha_n$) of the scaling circuit 143B. According to an example embodiment, the delta-sigma modulator 142 may generate the up, down, or hold signal UP, DN, or HOLD based on +$\alpha_p$ (e.g., the first code value '+1' scaled by the variable gain value $\alpha_p$) and −$\alpha_n$ (e.g., the second code value '−1' scaled by the fixed gain value an).

The delta-voltage DAC 141 may generate or adjust the reference voltage $V_{ref\_cal}$ based on the up, down, or hold signal UP, DN, or HOLD. For example, the delta-voltage DAC 141 may increase the reference voltage $V_{ref\_cal}$ when the up-signal UP is input, decrease the reference voltage $V_{ref\_cal}$ when the down-signal DN is input, and hold the reference voltage $V_{ref\_cal}$ when the hold signal HOLD is input. The generated reference voltage $V_{ref\_cal}$ may be provided to the comparator 130.

According to an example embodiment, the reference voltage generation circuit 140B may adjust the variable gain value $\alpha_p$ such that the average value of the first and second code values '+1' and '−1' of the phase error sign signal PHE_SIGN is zero. For example, the reference voltage generation circuit 140B may increase the variable gain value $\alpha_p$ when the down-current IDN is larger than the up-current IUP, and decrease the variable gain value $\alpha_p$ when the up-current IUP is larger than the down-current IDN.

Figure 7B:
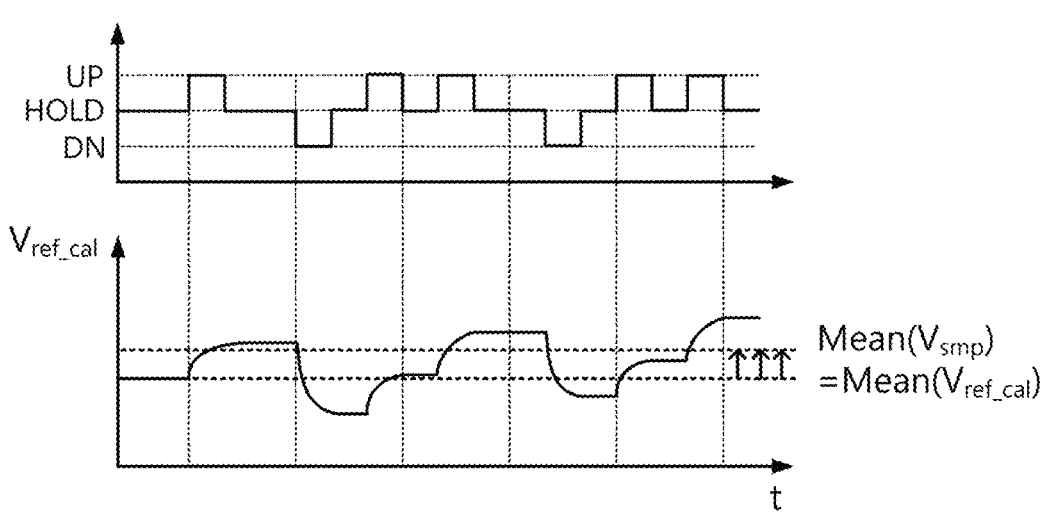
FIG. 7B is a diagram illustrating the operation of the phase error sign generator of FIG. 7A in the same situation as FIG. 6B.

FIG. 7B is a diagram illustrating the operation of the phase error sign generator of FIG. 7A in the same situation as FIG. 6B.

Referring to FIGS. 6B, 7A, and 7B, when the down-current IDN is larger than the up-current IUP, the delta-sigma modulator 142 may output more up-signals UP than down-signals DN even if the PLL circuit 100 or 100A is locked. When up-signals UP are more than down-signals DN, it indicates that an input of the delta-sigma modulator 142 is positive on average.

For the input average of the delta-sigma modulator 142 to be positive in the state in which the variable gain value $\alpha_p$ is the same as the fixed gain value an, the average value of the phase error sign signal PHE_SIGN should also be positive. In an example embodiment, the comparator 130 may output '+1' more than '−1.'

In an example embodiment, the average value of the reference voltage $V_{ref\_cal}$ is smaller than the average value of the phase error signal $V_{smp}$, as illustrated in FIGS. 6B and 7B. Therefore, an operation of increasing the magnitude of the reference voltage $V_{ref\_cal}$ is required.

According to an example embodiment, when the average value of the phase error sign signal PHE_SIGN is positive, the integral value of the integrator 75 may increase. Accordingly, the variable gain value $\alpha_p$ may increase. When the variable gain value $\alpha_p$ increases, the value of +$\alpha_p$ (e.g., the first code value '+1' scaled by the variable gain value $\alpha_p$ input to the delta-sigma modulator 142) may increase. As a value of +$\alpha_p$ increases, integral time before the up-signal UP is output (e.g., time for which the hold signal HOLD is applied before the up-signal UP is output) may be reduced. Therefore, the time it takes for the up-signal UP to be output from the delta-sigma modulator 142 may be reduced. When the time it takes for the up-signal UP to be output is reduced, the frequency of the up-signal UP increases naturally, and thus the reference voltage $V_{ref\_cal}$ may increase. As the reference voltage $V_{ref\_cal}$ increases, the average value of the reference voltage $V_{ref\_cal}$ may increase and the frequency of '+1' in PHE_SIGN may decrease. Then, when the average value of the reference voltage $V_{ref\_cal}$ equals the average value of the phase error signal $V_{smp}$, the average value of PHE_SIGN may converge to zero. For example, the variable gain value $\alpha_p$ and the reference voltage $V_{ref\_cal}$ may converge to values at a point in time at which the average value of PHE_SIGN is zero.

When the frequency of '+1' in PHE_SIGN decreases compared to the frequency of '−1,' the integral value of the integrator 75 may decrease, and thus the variable gain value $\alpha_p$ may decrease. When the variable gain value $\alpha_p$ decreases, the frequency of '+1' in PHE_SIGN may increase and the average value of PHE_SIGN may eventually converge to 0.

When the up-current IUP is larger than the down-current IDN, the delta-sigma modulator 142 may output more down-signals DN than up-signals UP even if the PLL circuit 100 or 100A is locked. When down-signals DN are more frequent than up-signals UP, it indicates that an input of the delta-sigma modulator 142 is negative on average.

For the input average of the delta-sigma modulator 142 to be negative in the state in which the variable gain value $\alpha_p$ is the same as the fixed gain value $\alpha_n$, the average value of the PHE_SIGN should also be negative. In an example embodiment, the comparator 130 may output '−1' more than '+1.'

In an example embodiment, unlike what is illustrated in FIGS. 6B and 7B, the average value of the reference voltage $V_{ref\_cal}$ is larger than the average value of the phase error signal $V_{smp}$. Therefore, an operation of decreasing the magnitude of the reference voltage $V_{ref\_cal}$ is used.

According to an example embodiment, when the average value of the phase error sign signal PHE_SIGN is negative, the integral value of the integrator 75 may decrease, and thus the variable gain value $\alpha_p$ may decrease. When the variable gain value $\alpha_p$ decreases, the value of $+\alpha_p$ (e.g., the first sign value '+1' scaled by the variable gain value $\alpha_p$) input to the delta-sigma modulator 142 may decrease. When the value of $+\alpha_p$ decreases, the time it takes for the up-signal UP to be output from the delta-sigma modulator 142 may decrease and the frequency of the up-signal UP may naturally decrease, so that the reference voltage $V_{ref\_cal}$ may decrease. As the reference voltage $V_{ref\_cal}$ decreases, the average value of the reference voltage $V_{ref\_cal}$ may decrease and the frequency of '+1' in the PHE_SIGN may increase. Then, when the average value of the reference voltage $V_{ref\_cal}$ is equal to the average value of the phase error signal $V_{smp}$, the average value of PHE_SIGN may converge to zero. For example, the variable gain value $\alpha_p$ and the reference voltage $V_{ref\_cal}$ may converge to values at a point in time at which the average value of the phase error sign signal PHE_SIGN is zero.

When the frequency of '+1' in PHE_SIGN becomes larger than the frequency of '−1,' the integral value of the integrator 75 may increase, and thus the variable gain value $\alpha_p$ may increase. When the variable gain value $\alpha_p$ increases, the frequency of '+1' in PHE_SIGN may decrease and the average value of PHE_SIGN may eventually converge to zero.

According to the above-described embodiment, even in a situation in which there is a mismatch between the up-current IUP and the down-current IDN of the delta-voltage DAC 141, an accurate phase error sign signal PHE_SIGN may be generated. As a result, an issue caused by the mismatch between the up-current IUP and the down-current IDN may be addressed.

Figure 8A:
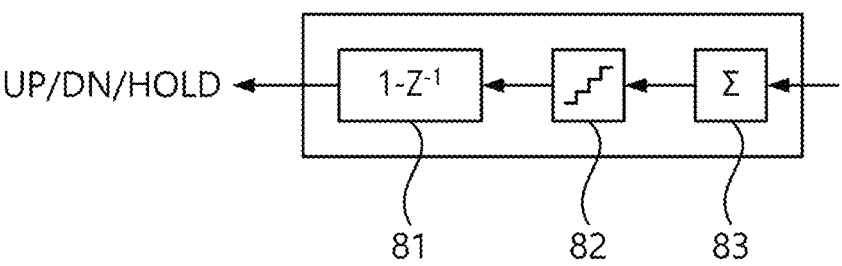
FIG. 8A is a block diagram of a first-order delta-sigma modulator according to an example embodiment.

FIG. 8A is a block diagram of a first-order delta-sigma modulator according to an example embodiment.

According to an example embodiment, the delta-sigma modulator 142 included in the reference voltage generation circuit 140 or 140A may be a first-order delta-sigma modulator. Referring to FIG. 8A, a first-order delta-sigma modulator 142A may include a digital integrator 83, a quantizer 82, and a differentiator 81.

When the phase error sign signal PHE_SIGN scaled by the scaling circuit 143 or 143B is input, the digital integrator 83 may integrate an input signal. A value integrated by the digital integrator 83 may be quantized by the quantizer 82, and the quantized value may be converted into an up-signal UP, a down-signal DN, or a hold signal HOLD by the differentiator 81 and provided to the delta-voltage DAC 141.

Figure 8B:
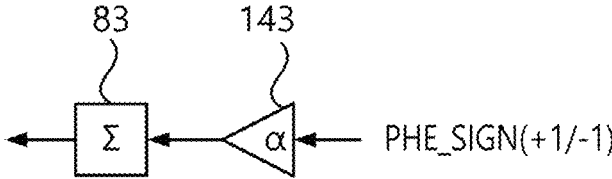
FIG. 8B is a block diagram illustrating a portion of components of a reference voltage generation circuit of FIG. 4.
Figure 8C:
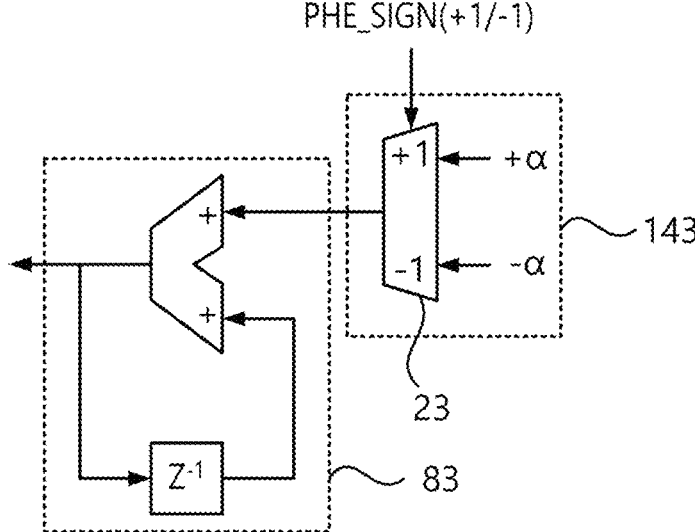
FIG. 8C is a block diagram illustrating an example of implementing the circuit of FIG. 8B.

FIG. 8B is a block diagram illustrating a portion of components of a reference voltage generation circuit of FIG. 4, and FIG. 8C is a block diagram illustrating an example of implementing the circuit of FIG. 8B.

Referring to FIG. 8B, the reference voltage generation circuit 140A may include a scaling circuit 143 and a digital integrator 83. In an example embodiment, the digital integrator 83 may constitute a portion of the first-order delta-sigma modulator 142A.

According to an example embodiment, the scaling circuit 143 and the digital integrator 83 may be implemented without using a multiplier by applying two constants (e.g., $+\alpha$ and $-\alpha$) having different sign values as an input of the integrator 83, as illustrated in FIG. 8C. In this case, an absolute value of each of the constants may be the same as a gain value a of the scaling circuit 143. For example, when the phase error sign signal PHE_SIGN is '+1,' the constant $+\alpha$ may be input to the integrator 83 through the multiplexer 23. In addition, when the phase error sign signal PHE_SIGN is '+1,' $-\alpha$ may be input to the integrator 83 through the multiplexer 23.

Figure 9:
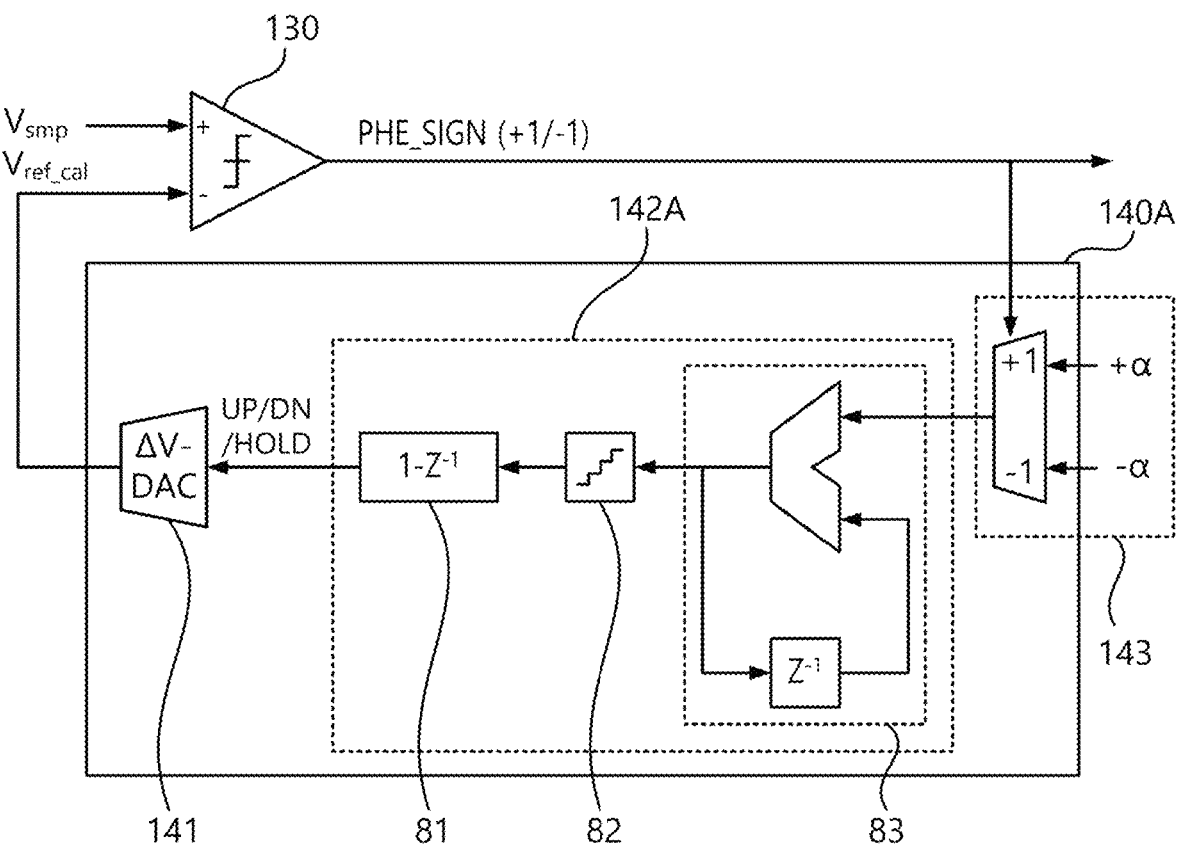
FIG. 9 is a block diagram illustrating an example of implementing the phase error sign generator of FIG. 4.

FIG. 9 is a block diagram illustrating an example of implementing the phase error sign generator of FIG. 4. Referring to FIG. 9, the phase error sign generator 400A may include a comparator 130 and a reference voltage generation circuit 140A. The delta-sigma modulator 142A illustrated in FIG. 8A may be used as a delta-sigma modulator 142 of the reference voltage generation circuit 140A. In addition, the scaling circuit 143 may be implemented without using a multiplier by applying two constants (e.g., $+\alpha$ and $-\alpha$) as an input of the integrator 83, as illustrated in FIG. 8C.

Figure 10:
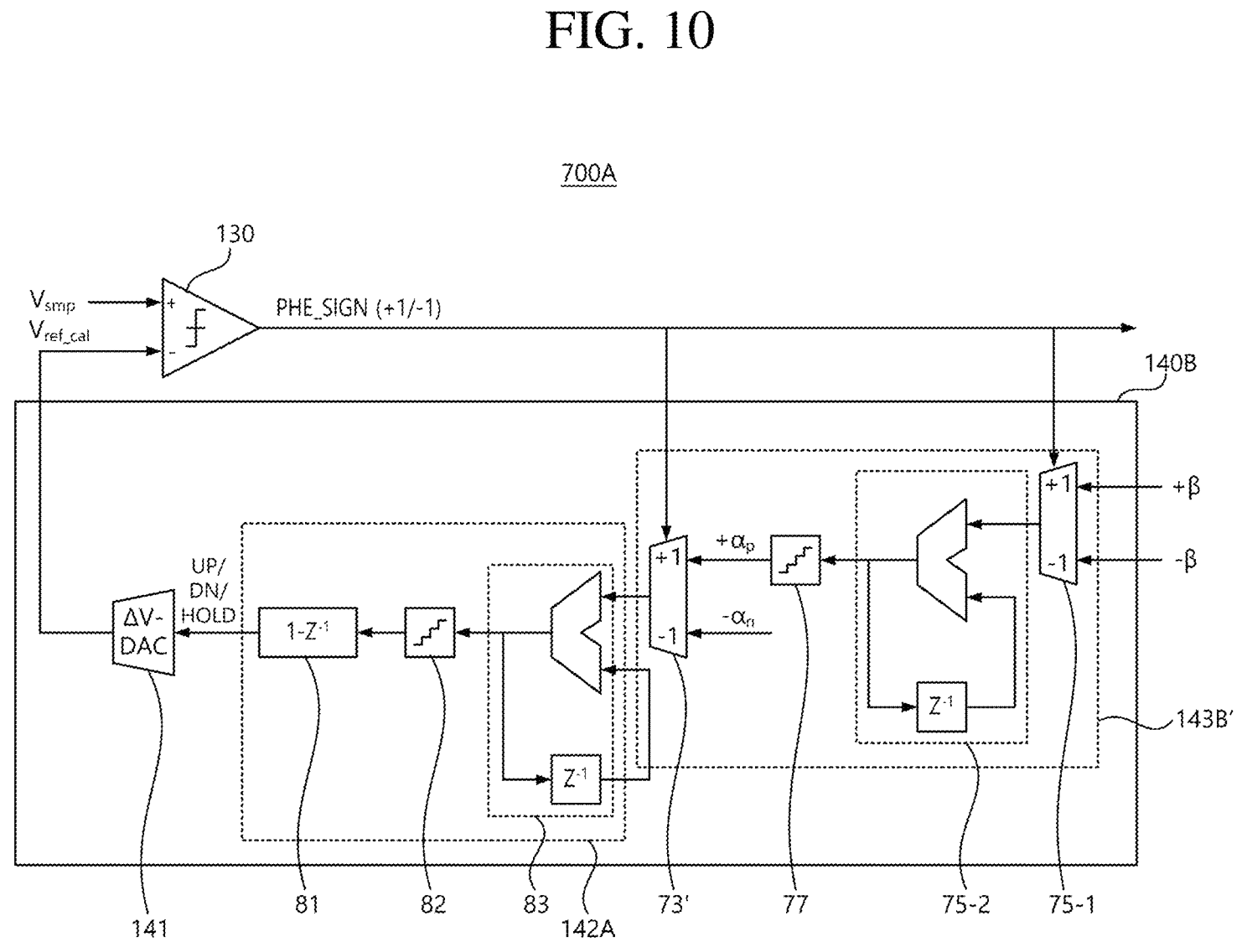

FIG. 10 is a block diagram illustrating an example of implementing the phase error sign generator of FIG. 7A. Referring to FIG. 10, a phase error sign generator 700A may include a comparator 130 and a reference voltage generation circuit 140B. In an example embodiment, the first-order delta-sigma modulator 142A illustrated in FIG. 8A may be used as a delta-sigma modulator 142 of the reference voltage generation circuit 140B.

A scaling circuit 143B' may include a first multiplexer 75-1, an integrator 75-2, a quantizer 77, and a second multiplexer 73'.

The first multiplexer 75-1 may output a first constant $+\beta$ and the second constant $-\beta$ to the integrator 75-2 based on a phase error sign signal PHE_SIGN. In an example embodiment, the first constant $+\beta$ and the second constant $-\beta$ may correspond to first and second sign values '+1' and '−1' of the phase error sign signal PHE_SIGN, respectively, and may have different sign values. The first constant $+\beta$ and the second constant $-B$ may have the same absolute value less than 1.

The first multiplexer 75-1 may sequentially output the first constant $+\beta$ and the second constant $-B$ according to the order of the first and second sign values '+1' and '−1' of the phase error sign signal PHE_SIGN. For example, when the phase error sign signal PHE_SIGN is '+1,' the first multiplexer 75-1 may output the first constant $+\beta$ to the integrator 75-2. In addition, when the phase error sign signal PHE_SIGN is '−1,' the first multiplexer 75-1 may output the second constant $-\beta$ to the integrator 75-2.

The integrator 75-2 may integrate an output of the first multiplexer 75-1. The quantizer 77 may quantize an integral value of the integrator 75-2 to generate a variable gain value $\alpha_p$.

The second multiplexer 73' may provide the variable gain value $\alpha_p$ or a fixed gain value $-\alpha_n$ generated by the quantizer 77 to the delta-sigma modulator 142A based on the phase error sign signal PHE_SIGN. For example, when the phase error sign signal PHE_SIGN is '+1,' the second multiplexer 73' may provide the variable gain value $\alpha_p$ to the integrator 83. In addition, when the phase error sign signal PHE_SIGN is '−1,' the second multiplexer 73' may provide the fixed gain value $-\alpha_n$ to the integrator 83.

Comparing the scaling circuit 143B' of FIG. 10 with the scaling circuit 143 of FIG. 7A, the first multiplexer 75-1 and the integrator 75-2 may perform the function of the integrator 75 included in the scaling circuit 143B of FIG. 7A. In addition, the second multiplexer 73' may perform the function of the multiplexer 73 of FIG. 7. In addition, the integrator 75-2 and the quantizer 77 may play the role of the variable gain logic 74 of FIG. 7A. The fixed gain value $-\alpha_n$ may be applied as a constant to perform the function of the fixed gain logic 72 of FIG. 7A.

It can be seen that the scaling circuit 143B' of FIG. 10 also provides the variable gain value $\alpha_p$ and the fixed gain value $\alpha_n$ as an input of the integrator 83 and is implemented without using a multiplier.

As described above, an example has been provided in which a gain value corresponding to the sign value '+1' of the phase error sign signal PHE_SIGN may be used as a variable gain value, and a gain value corresponding to the sign value '−1' of the phase error sign signal PHE_SIGN may be used as a fixed gain value. However, example embodiments are not limited thereto. According to an example embodiment, the gain value corresponding to '+1' may be used as the fixed gain value and the gain value corresponding to '−1' may be used as the variable gain value. Such an embodiment will be described with reference to FIG. 11.

Figure 11:
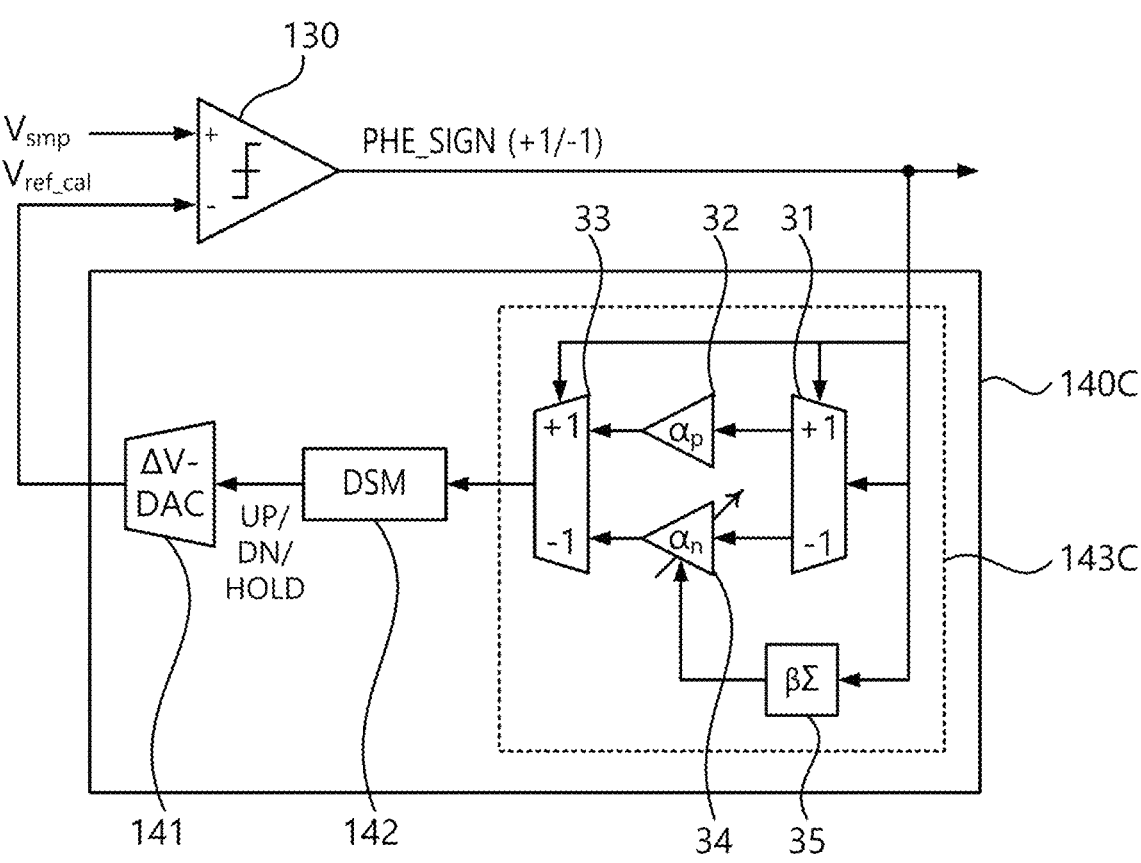
FIG. 11 is a block diagram of a phase error sign generator according to an example embodiment.

FIG. 11 is a block diagram of a phase error sign generator according to an example embodiment. In the description of FIG. 11, duplicate descriptions of the same components as described above may be omitted. A phase error sign generator 1100 of FIG. 11 may constitute a portion of the PLL circuit 100, 100A, and 100B of FIGS. 1, 2 and 13, but example embodiments are not limited thereto. Referring to FIG. 11, the phase error sign generator 1100 may include a comparator 130 and a reference voltage generation circuit 140C. The reference voltage generation circuit 140C may include a delta-voltage DAC 141, a delta-sigma modulator 142, and a scaling circuit 143C.

The reference voltage generation circuit 140C may scale each of the first and second sign values '+1' and '−1' of the phase error sign signal PHE_SIGN based on the fixed gain value $\alpha_p$ and the variable gain value $\alpha_n$, respectively, and may generate a reference voltage $V_{ref\_cal}$ based on the scaled first and second sign values.

To this end, the scaling circuit 143C may include a demultiplexer 31, a fixed gain logic 32, a multiplexer 33, a variable gain logic 34, and an integrator 35.

The demultiplexer 31 may transmit each of the first and second sign values '+1' and '−1' of the phase error sign signal PHE_SIGN to a corresponding gain logic. '+1' of the first and second sign values may correspond to the fixed gain logic 32 and '−1' of the first and second sign values may correspond to the variable gain logic 34. The demultiplexer 31 may transmit the first and second sign values '+1' and '−1' of the received phase error sign signal PHE_SIGN to the fixed gain logic 32 and the variable gain logic 34, respectively.

The fixed gain logic 32 may scale a first sign value (e.g., '+1') transmitted from the demultiplexer 31 by the fixed gain value $\alpha_p$ and output the scaled first sign value to the multiplexer 33. The variable gain logic 34 may scale a second sign value (e.g., '−1') transmitted from the demultiplexer 31 by the variable gain value $\alpha_n$ and output the scaled second sign value to the multiplexer 33. In an example embodiment, the fixed gain value $\alpha_p$ and the variable gain value $\alpha_n$ are positive numbers less than 1 and may have different values.

The multiplexer 33 may output the value received from the fixed gain logic 32 or the variable gain logic 34 to the delta-sigma modulator 142.

As described above, when the first and second sign values '+1' are input to the scaling circuit 143C, $+\alpha_p$ may be input to the delta-sigma modulator 142. In addition, when the first and second sign values '−1' are input to the scaling circuit 143C, $-\alpha_n$ may be input to the delta-sigma modulator 142.

The integrator 35 may multiply each of the first and second sign values '+1' and '−1' of the phase error sign signal PHE_SIGN by a constant $\beta$ and integrate the multiplied value. The constant $\beta$ may be negative and may have the same absolute value less than 1. The variable gain value $\alpha_n$ may be determined based on the integral value of the integrator 35.

The delta-sigma modulator 142 may generate a 2-bit up, down, or hold signal UP, DN, or HOLD based on the output values ($+\alpha_p$ and $-\alpha_n$) of the scaling circuit 143C. The delta-sigma modulator 142 may generate UP, DN, or HOLD based on $+\alpha_p$ (for example, the first sign value '+1' scaled by the fixed gain value $\alpha_p$) and $-\alpha_n$ (for example, the second sign value '−1' scaled by the variable gain value $\alpha_n$).

The delta-voltage DAC 141 may generate or adjust the reference voltage $V_{ref\_cal}$ based on the up, down, or hold signal UP, DN, or HOLD. For example, the delta-voltage DAC 141 may increase $V_{ref\_cal}$ when an up-signal UP is input, decrease $V_{ref\_cal}$ when a down-signal UP is input, and hold $V_{ref\_cal}$ when a hold signal HOLD is input. The generated reference voltage $V_{ref\_cal}$ may be provided to the comparator 130.

The reference voltage generation circuit 140C may adjust the variable gain value In such that an average value of the first and second sign values '+1' and '−1' of the phase error sign signal PHE_SIGN is zero. For example, the reference voltage generation circuit 140C may decrease the variable gain value $\alpha_n$ when down-current IDN is larger than up-current IUP, and may increase the variable gain value $\alpha_n$ when the up-current IUP is larger than the down-current IDN.

For example, referring to FIG. 6B, when the down-current IDN is larger than the up-current IUP, the delta-sigma modulator 142 may output more up-signals UP than down-signals DN even if the PLL circuit 100 or 100A is locked. When the up-signals UP are more frequent than the down-signals DN, this indicates that an input of the delta-sigma modulator 142 is positive on average.

For the input average of the delta-sigma modulator 142 to be positive in the state in which the variable gain value $\alpha_n$ is the same as the fixed gain value $\alpha_p$, an average value of the phase error sign signal PHE_SIGN should also be positive. In an example embodiment, the comparator 130 may output '+1' more frequently than '−1.'

In an example embodiment, an average value of the reference voltage $V_{ref\_cal}$ is smaller than an average value of the phase error signal $V_{smp}$, so that an operation of increasing the magnitude of the reference voltage $V_{ref\_cal}$ is required.

According to an example embodiment, when the average value of the phase error sign signal PHE_SIGN is positive, the constant $\beta$ is negative, so the integral value of the integrator 35 may decrease. Accordingly, the variable gain value $\alpha_n$ may decrease. When the variable gain value $\alpha_n$ decreases, a value of $-\alpha_n$ (for example, the second sign value '−1' scaled by the variable gain value $\alpha_n$) input to the delta-sigma modulator 142 may decrease. Accordingly, the time it takes for a down-signal DN to be output may increase, and the frequency of the down-signal DN may naturally decrease, so that the reference voltage $V_{ref\_cal}$ may increase. As $V_{ref\_cal}$ increases, the average value of $V_{ref\_cal}$ may increase and the frequency of '−1' (relative to the frequency of '+1') in PHE_SIGN may increase. Then, when the average value of $V_{ref\_cal}$ is equal to the average value of the phase error signal $V_{smp}$, the average value of PHE_SIGN may converge to zero. For example, the variable gain value $\alpha_n$ and the reference voltage $V_{ref\_cal}$ converge to values at a point in time at which the average value of PHE_SIGN is zero.

When the frequency of '−1' becomes higher than the frequency of '+1' in PHE_SIGN, the integral value of the integrator 35 may increase. Accordingly, the variable gain value $\alpha_n$ may increase. When the variable gain value $\alpha_n$ increases, the frequency of '−1' in PHE_SIGN may decrease and the average value of PHE_SIGN may eventually converge to zero.

When the up-current IUP is larger than the down-current IDN, the delta-sigma modulator 142 may output more down-signals DN than up-signals UP even if the PLL circuit 100 or 100A is locked. When there are more down-signals DN than up-signals UP, this indicates that an input of the delta-sigma modulator 142 is negative on average.

For the input average of the delta sigma modulator 142 to be negative in the state in which the variable gain value $\alpha_n$ is the same as the fixed gain value $\alpha_p$, the average value of PHE_SIGN should also be negative. In an example embodiment, the comparator 130 may output '−1' more often than '+1.'

In an example embodiment, unlike what is illustrated in FIG. 6B, the average value of the reference voltage $V_{ref\_cal}$ may be larger than the average value of the phase error signal $V_{smp}$. Therefore, an operation of decreasing the reference voltage $V_{ref\_cal}$ may be implemented.

When the average value of PHE_SIGN is negative, the integral value of the integrator 35 may increase. Accordingly, the variable gain value $\alpha_n$ may increase. When the variable gain value $\alpha_n$ increases, the value of $−\alpha_n$ (for example, the second sign value '−1' scaled by the variable gain value $\alpha_n$) input to the delta sigma modulator 142 may increase. Accordingly, the time it takes for a down-signal DN to be output may be reduced and the frequency of the down-signal DN may increase, so that the reference voltage $V_{ref\_cal}$ may be reduced. As the reference voltage $V_{ref\_cal}$ decreases, an average value of the reference voltage $V_{ref\_cal}$ may decrease and the frequency of '−1' in PHE_SIGN may decrease. Then, when the average value of the reference voltage $V_{ref\_cal}$ becomes equal to the average value of the phase error signal $V_{smp}$, the average value of PHE_SIGN may converge to zero. For example, the variable gain value $\alpha_n$ and the reference voltage $V_{ref\_cal}$ converge to values at a point in time at which the average value of PHE_SIGN is zero.

When the frequency of '−1' in PHE_SIGN becomes smaller than the frequency of '+1,' the integral value of the integrator 35 may decrease. Accordingly, the variable gain value $\alpha_n$ may decrease. When the variable gain value $\alpha_n$ decreases, the frequency of '−1' PHE_SIGN may increase and the average value of PHE_SIGN may eventually converge to zero.

According to the above-described embodiment, an accurate phase error sign signal PHE_SIGN may be generated even in a situation in which there is a mismatch between the up-current IUP and down-current IDN of the delta voltage DAC 141. Accordingly, a performance degradation issue caused by the mismatch between the up-current IUP and the down-current IDN may be overcome.

Figure 12A:
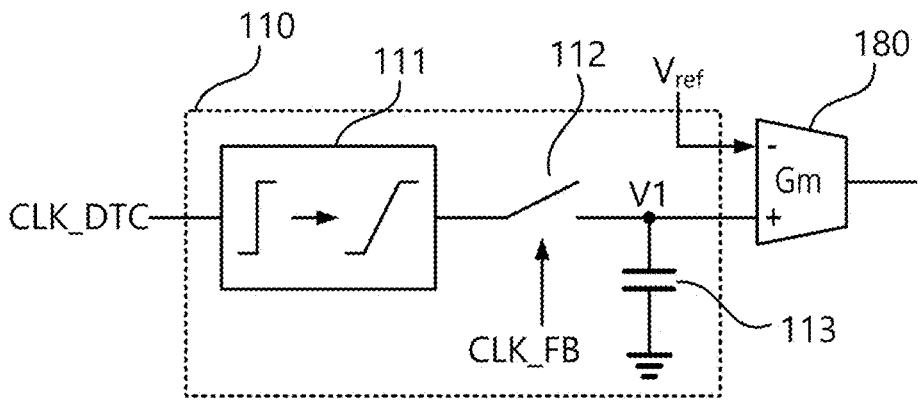
FIG. 12A is a block diagram illustrating an example of implementing a phase detector according to an example embodiment.
Figure 12B:
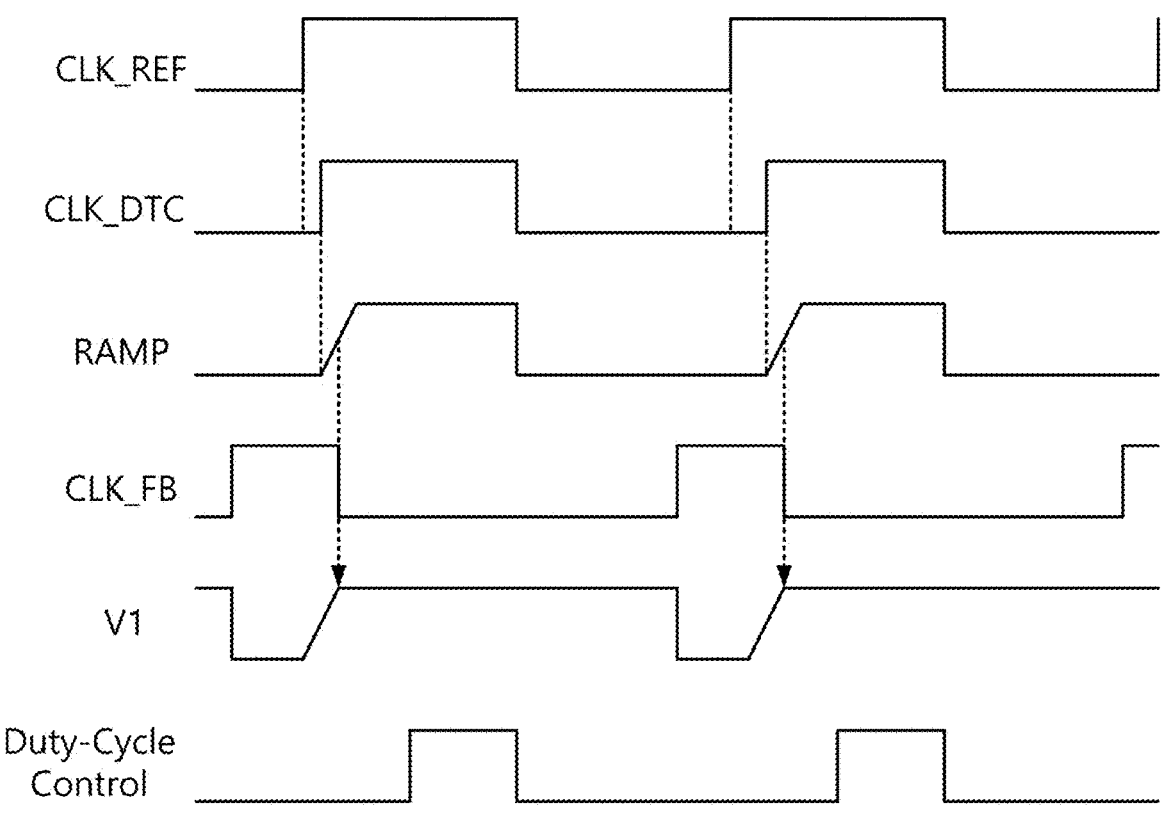
FIG. 12B is a timing diagram of various signals related to the phase detector of FIG. 12A.

FIG. 12A is a block diagram illustrating an example of implementing a phase detector according to an example embodiment, and FIG. 12B is a timing diagram of various signals related to the phase detector of FIG. 12A.

Referring to FIG. 12A, the phase detector 110 may include a ramp voltage generator 111, a sampling switch

112, and a sampling capacitor 113. The ramp voltage generator 111 may generate a ramp voltage RAMP having a predetermined slope based on a DTC output signal CLK_DTC output from the DTC 150. The sampling switch 112 may sample the ramp voltage RAMP based on a feedback clock signal CLK_FB. The sampling capacitor 113 may hold a voltage sampled by the sampling switch 112.

Referring to FIG. 12B, the ramp voltage generator 111 may be triggered by a rising edge of the DTC output signal CLK_DTC to generate the ramp voltage RAMP. The sampling switch 112 may be triggered by a falling edge of the feedback clock signal CLK_FB to sample the ramp voltage RAMP. A voltage sampled at a node V1 may include phase error information, and may be the above-described phase error signal $V_{smp}$.

Figure 13:
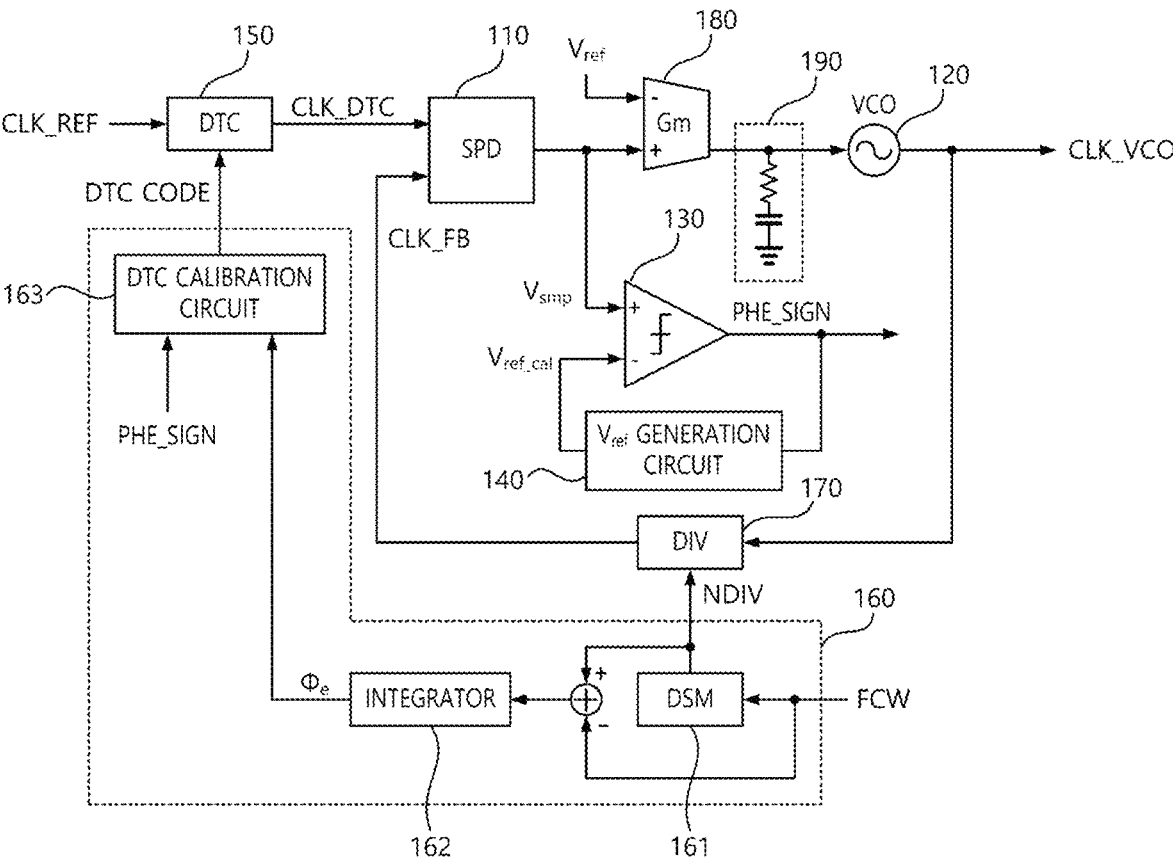
FIG. 13 is a block diagram of a PLL circuit according to an example embodiment.

FIG. 13 is a block diagram of a PLL circuit according to an example embodiment. A PLL circuit 100B of FIG. 13 may be an example of implementing the PLL circuits 100 and 100A of FIGS. 1 and 2. Referring to FIG. 13, the PLL circuit 100B may include a phase detector 110, a VCO 120, a comparator 130, a reference voltage generation circuit 140, a digital-to-time converter (DTC) 150, a control code generation circuit 160, a divider 170, a Gm circuit 180, and a loop filter 190. In the description of FIG. 13, duplicate descriptions of the same components as described above may be omitted.

The control code generation circuit 160 may generate a division ratio code NDIV and a DTC code based on a frequency control word (FCW) provided from an external source. To this end, the control code generation circuit 160 may include a delta-sigma modulator 161, an integrator 162, and a DTC calibration circuit 163.

The delta-sigma modulator 161 may generate a division ratio code NDIV based on the frequency control word FCW and provide the generated division ratio code NDIV to the divider 170. In an example embodiment, the frequency control word FCW may specify a desired frequency synthesis ratio. The divider 170 may generate a feedback clock signal CLK_FB from an output clock signal CLK_VCO based on the division ratio code NDIV and provide the generated feedback clock signal CLK_FB to the phase detector 110.

The integrator 162 may integrate a quantization error (for example, a difference $q_e$ between the division ratio code NDIV and the frequency control word FCW) to generate a phase error code $\Phi_e$. The phase error code $\Phi_e$ may be a code representing the degree of delay of a reference clock signal CLK_REF by the DTC 150.

The DTC calibration circuit 163 may generate a DTC code based on the phase error code $\Phi_e$ and a phase error sign signal PHE_SIGN. For example, the DTC calibration circuit 163 may calibrate the phase error code $\Phi_e$ based on the phase error code $\Phi_e$ and the phase error sign signal PHE_SIGN, and may output the calibrated phase error code $\Phi_e$ as a DTC code. The DTC code may be provided to the DTC 150, and may determine the degree of delay of the reference clock signal CLK_REF.

Figure 14A:
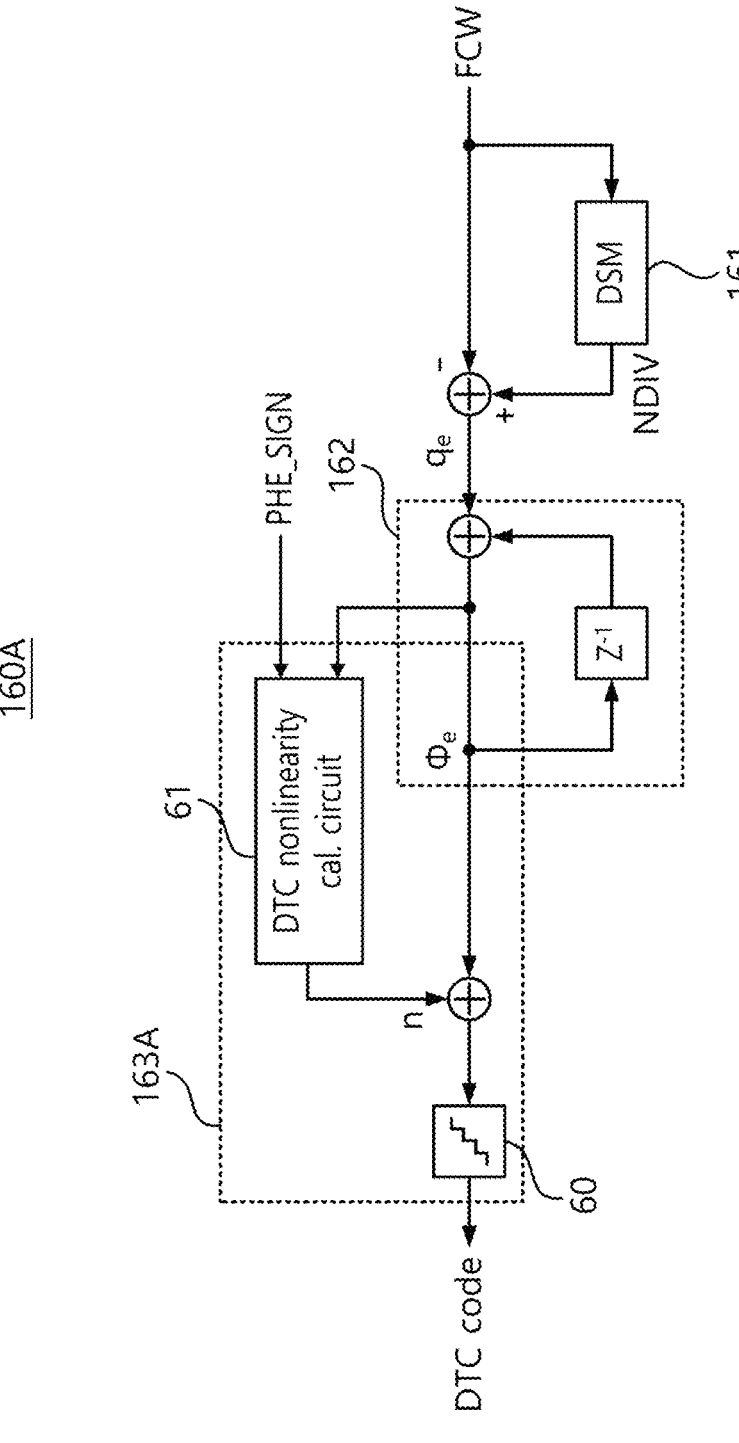
FIG. 14A is a block diagram illustrating an example of implementing a control code generation circuit according to an example embodiment.
Figure 14B:
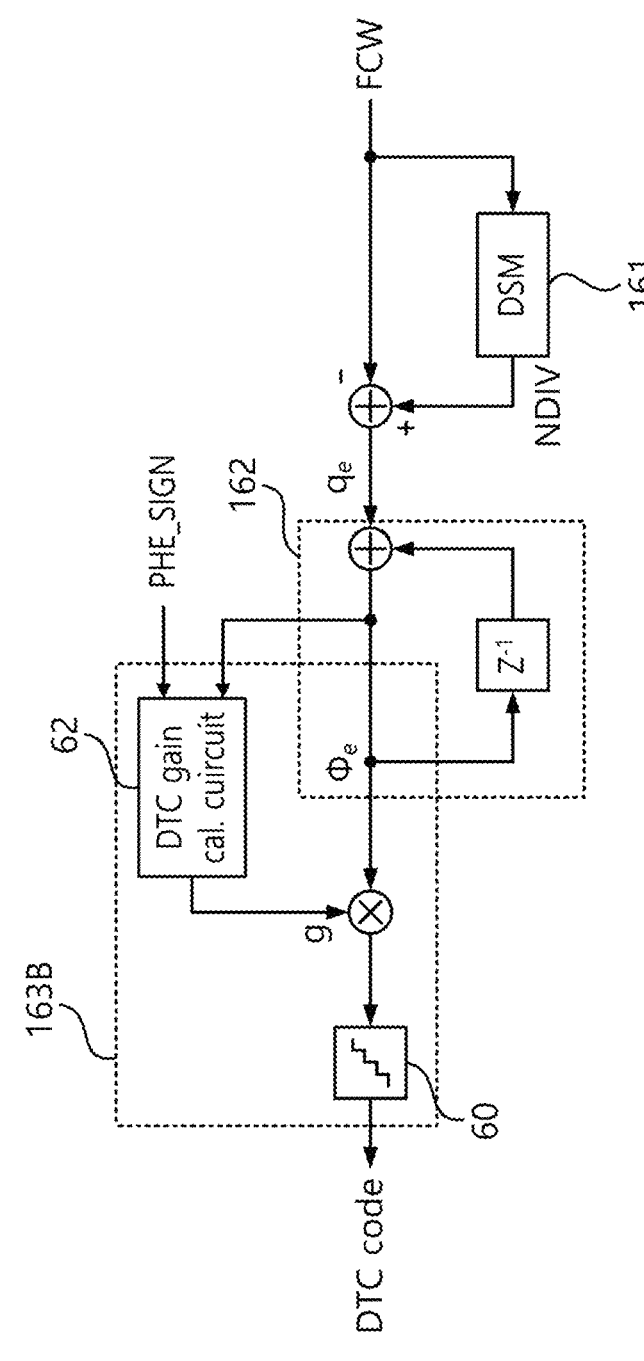
FIG. 14B is a block diagram illustrating an example of implementing a control code generation circuit according to an example embodiment.
Figure 14C:
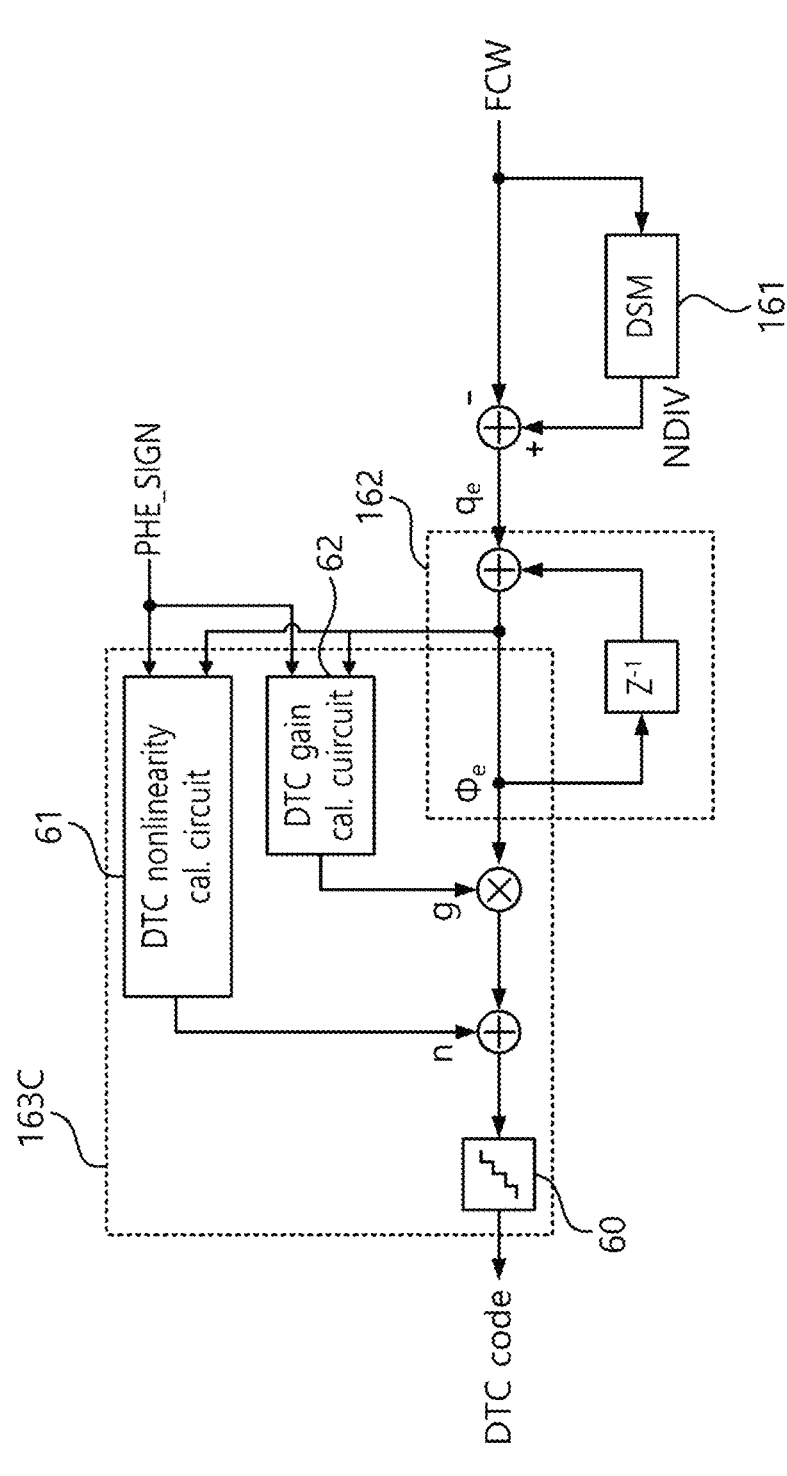
FIG. 14C is a block diagram illustrating an example of implementing a control code generation circuit according to an example embodiment.

FIGS. 14A to 14C are diagrams illustrating examples of implementing a control code generation circuit according to various embodiments. In the description of FIGS. 14A to 14C, duplicate descriptions of the same components as described above may be omitted.

Referring to FIG. 14A, a control code generation circuit 160A may include a delta-sigma modulator 161, an integrator 162, and a DTC calibration circuit 163A. The DTC calibration circuit 163A may include a DTC nonlinearity calibration circuit 61 and a quantizer 60.

The DTC 150 may have nonlinear characteristics, which may be a major cause of increased fractional spurs. The nonlinearity of the DTC 150 may be mitigated by calibrating the DTC code input to the DTC 150 using a digital correction method. Accordingly, fractional spurs may be reduced.

To this end, the DTC nonlinearity calibration circuit 61 may generate an offset value n to calibrate the nonlinearity of the DTC 150 based on a phase error sign signal PHE_SIGN and a phase error code $\Phi_e$. The generated offset value n may be added to the phase error code $\Phi_e$ to calibrate the nonlinearity of the DTC 150.

The quantizer 60 may quantize the phase error code $\Phi_e$, added with the offset value n, to generate a DTC code.

Referring to FIG. 14B, the control code generation circuit 160B may include a delta-sigma modulator 161, an integrator 162, and a DTC calibration circuit 163B. The DTC calibration circuit 163B may include a DTC gain calibration circuit 62 and a quantizer 60.

The DTC gain correction circuit 62 may generate a DTC gain value g to scale the phase error code $\Phi_e$ based on the phase error sign signal PHE_SIGN and the phase error code $\Phi_e$. The generated gain value g may be scaled to the phase error code $\Phi_e$.

The quantizer 60 may quantize the phase error code $\Phi_e$, scaled by the gain value g, to generate a DTC code.

Referring to FIG. 14C, the control code generation circuit 160C may include a delta-sigma modulator 161, an integrator 162, and a DTC calibration circuit 163C. The DTC calibration circuit 163C may include a DTC nonlinearity calibration circuit 61, a DTC gain calibration circuit 62, and a quantizer 60.

The gain value g generated by the DTC gain calibration circuit 62 may be scaled to the phase error code $\Phi_e$. In addition, the offset value n generated by the DTC nonlinearity calibration circuit 61 may be added to the phase error code $\Phi_e$.

The quantizer 60 may quantize the phase error code $\Phi_e$, scaled by the gain value g and added with the offset value n, to generate a DTC code.

Figure 15:
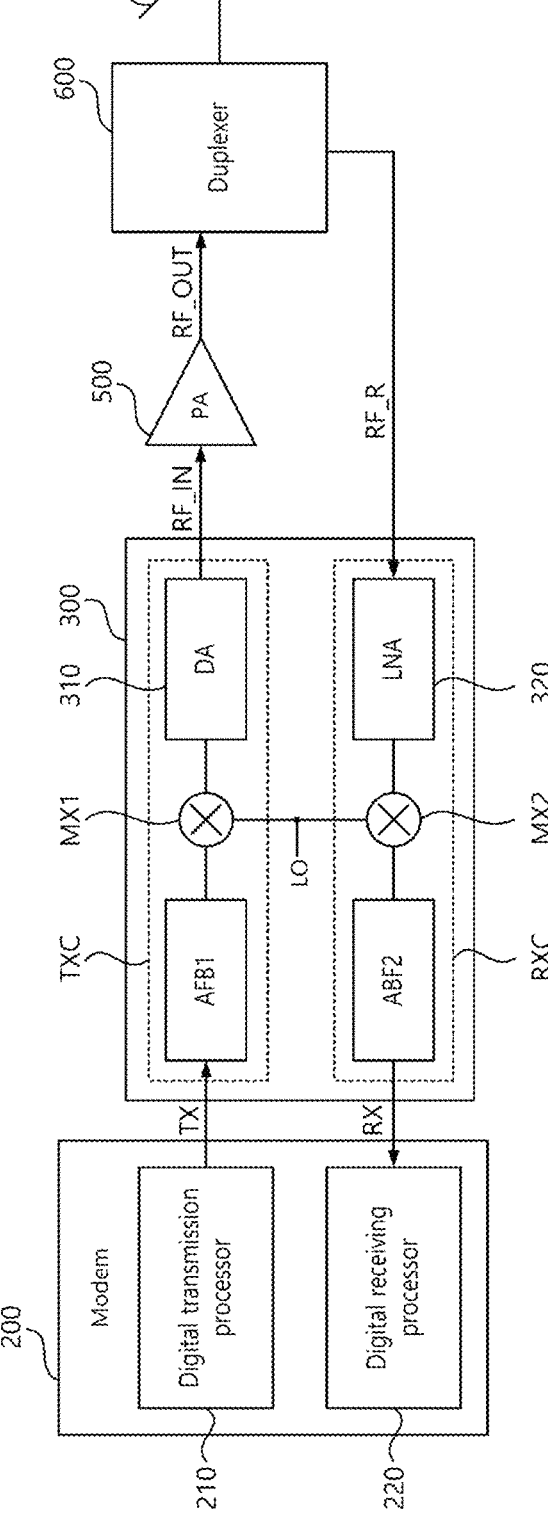
FIG. 15 is a block diagram of a wireless communication module according to an example embodiment.

FIG. 15 is a block diagram of a wireless communication module according to an example embodiment. Referring to FIG. 15, a wireless communication module 1000 may include a modem 200, a radio-frequency integrated circuit (RFIC) 300, a power amplifier 500, a duplexer 600, and an antenna ANT.

The modem 200 may include a digital transmission processor 210 and a digital receiving processor 220. The modem 200 may process a baseband signal, including information to be transmitted, based on a predetermined communication method through the digital transmission processor 210. In addition, the modem 200 may process the received baseband signal based on a predetermined communication method through the digital receiving processor 220. For example, the modem 200 may process the signal to be transmitted and/or the received signal based on a communication method such as orthogonal frequency division multiplexing (OFDM), orthogonal frequency division multiple access (OFDMA), wideband code multiple access (WCDMA), or high speed packet access+ (HSPA+). In addition, the modem 200 may process baseband signals based on various types of communication methods such as Bluetooth, Wi-Fi, and mobile communication.

The modem 200 may perform digital-to-analog conversion of a baseband signal using the digital-to-analog converter provided therein and generate a transmit signal TX, an analog signal. In addition, the modem 200 may receive a receive signal RX, an analog signal, from the RFIC 300 and perform analog-to-digital conversion of the receive signal RX through the analog-to-digital converter provided therein to extract a baseband signal, a digital signal.

The RFIC 300 may perform up-conversion on the transmit signal TX to generate an RF input signal RFIN, or perform down-conversion on the RF receive signal RF_R to generate a receive signal RX. For example, the RFIC 300 may include a transmission circuit TXC for up-conversion, a receiving circuit RXC for down-conversion, and a local oscillator LO.

The transmission circuit TXC may include a first analog baseband filter ABF1, a first mixer MX1, and a driving amplifier (DA) 310. For example, the first analog baseband filter AFB1 may include a low-pass filter.

The baseband filter ABF1 may filter the transmit signal TX received from the modem 200 and provide the filtered transmit signal to the first mixer MX1. The first mixer MX1 may perform frequency up-conversion to convert a frequency of the transmit signal TX into a high-frequency band from baseband, through a frequency signal (a reference frequency source) provided by the local oscillator LO. The frequency up-conversion may allow the transmit signal TX to be provided to the driving amplifier 310 as an RF signal. The driving amplifier 310 may perform first amplification on the RF signal and provide the amplified RF signal to the power amplifier 500 as an RF input signal RF_IN. The power amplifier 500 may amplify power of the RF input signal RF_IN to generate an RF output signal RF_OUT and transmit the generated RF output signal RF_OUT to the duplexer 600.

The receiving circuit RXC may include a second analog baseband filter ABF2, a second mixer MX2, and a low-noise amplifier (LNA) 320. For example, the second analog baseband filter ABF2 may include a low-pass filter.

The low-noise amplifier 320 may amplify the RF receive signal RF_R received from the duplexer 600 and provide the amplified RF receive signal to the second mixer MX2. The second mixer MX2 may perform frequency down-conversion to convert a frequency of the signal provided by the low-noise amplifier 320 to baseband from a high-frequency band, through a frequency signal provided by the local oscillator LO. The receive signal RX generated through frequency down-conversion may be provided to the second analog baseband filter ABF2, and the second analog baseband filter ABF2 may filter the receive signal RX and provide the filtered receive signal to the modem 200.

The local oscillator LO may provide a predetermined frequency source to the first and second mixers MX1 and MX2. In an example embodiment, the local oscillator LO may be or include the above-described PLL circuit 100, 100A, or 100B and/or the above-described phase error sign generator 400, 400A, 700A, or 1100.

The duplexer 600 may be connected to the antenna ANT to separate a transmission frequency and a receiving frequency. For example, the duplexer 600 may separate an RF output signal RF_OUT, transmitted from the power amplifier 500, for each frequency band and provide the separated RF output signal to a corresponding antenna ANT. In addition, the duplexer 600 may provide an external signal, received from the antenna ANT, to the low-noise amplifier 320 of the reception circuit RXC of the RFIC 300. For example, the duplexer 600 may include a front end module with integrated duplexer (FEMiD).

According to an example embodiment, the wireless communication module 1000 may be provided with a switch structure, which may separate the transmission frequency and the receiving frequency, instead of the duplexer 600. In addition, the wireless communication module 1000 may be provided with a structure including a duplexer 600 and a switch to separate the transmission frequency and the receiving frequency.

The antenna ANT may transmit the frequency-separated RF output signal RF_OUT to the outside or provide the RF receive signal RF_R received from the outside to the duplexer 600 by the duplexer 600. For example, the antenna ANT may include an array antenna, but example embodiments are not limited thereto.

According to an example embodiment, the modem 200, the RFIC 300, the power amplifier 500, and the duplexer 600 may be individually implemented as an IC, a chip, or a module. Alternatively, the modem 200, the RFIC 300, the power amplifier 500, and the duplexer 600 may be mounted together on a printed circuit board (PCB). In various embodiments, at least a portion of the modem 200, the RFIC 300, the power amplifier 500, and the duplexer 600 are implemented as a single chip.

The wireless communication module 1000 may be included in a wireless communication system using a cellular network such as 5G or LTE, or may be included in a wireless local area network (WLAN) system or any other wireless communication systems. Note that the configuration of the wireless communication module 1000 illustrated in FIG. 15 is only an example. The wireless communication module 1000 may have various configurations depending on the communication protocol or communication method.

Figure 16:
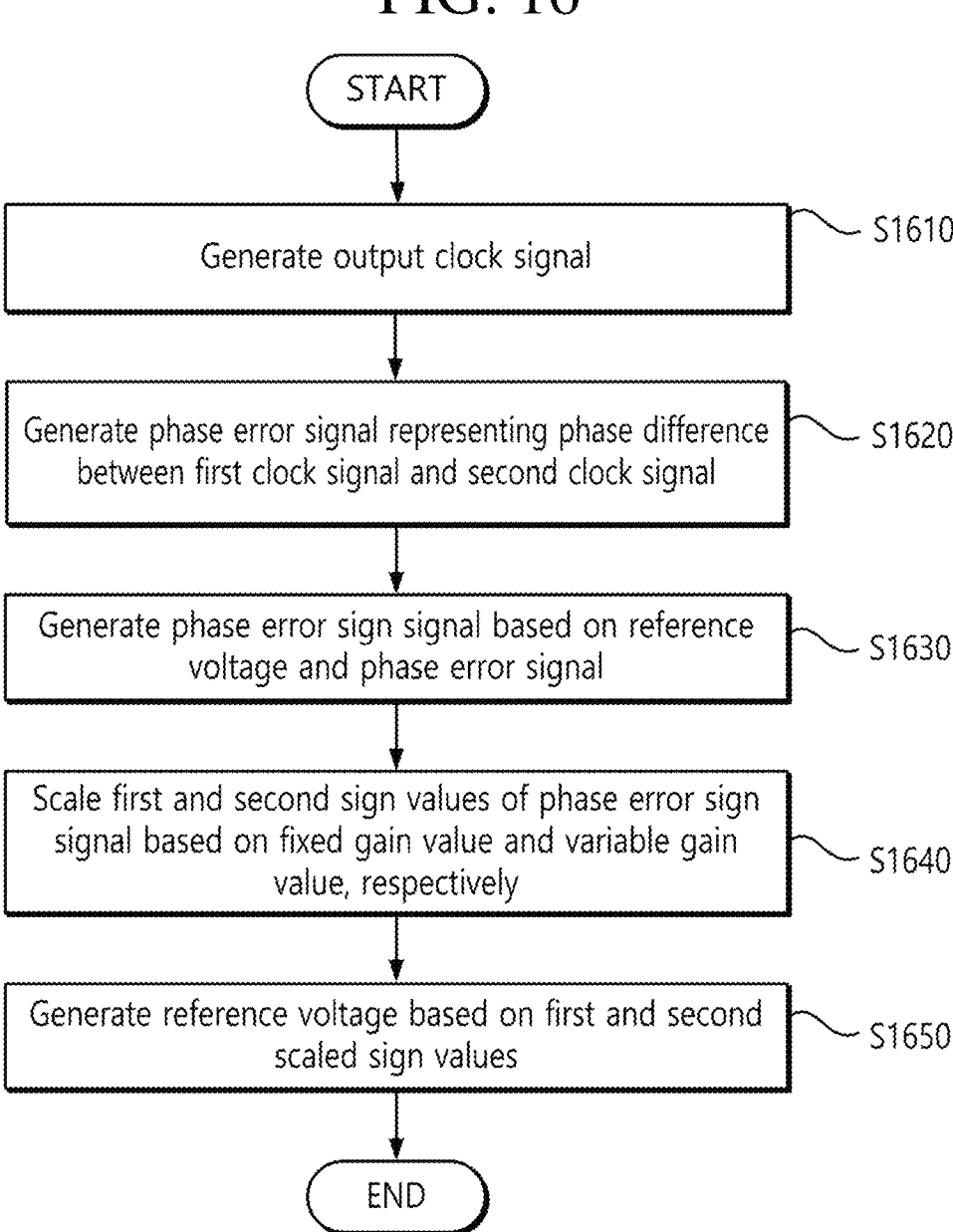
FIG. 16 is a flowchart illustrating a method of operating a PLL circuit according to an example embodiment.

FIG. 16 is a flowchart illustrating a method of operating a PLL circuit according to an example embodiment.

Referring to FIG. 16, in operation S1610, the PLL circuit 100, 100A, or 100 may generate an output clock signal CLK_VCO.

In operation S1620, the PLL circuit 100, 100A, or 100 may generate a phase error signal $V_{smp}$ representing a phase difference between a first clock signal and a second clock signal. The first clock signal may be a DTC output signal CLK_DTC generated by the DTC 150 based on a reference clock signal CLK_REF. In addition, the second clock signal may be a feedback clock signal CLK_FB generated by the divider 170 based on an output clock signal CLK_VCO. The phase error signal $V_{smp}$ may include information on a phase error.

In operation S1630, the PLL circuit 100, 100A, or 100 may generate a phase error sign signal PHE_SIGN based on a reference voltage $V_{ref\_cal}$ and the phase error signal $V_{smp}$. PHE_SIGN may be a signal representing a relationship in terms of magnitude between a voltage of the phase error signal $V_{smp}$ and the reference voltage $V_{ref\_cal}$. PHE_SIGN may represent sign information of a phase error between a DTC output signal CLK_DTC and a feedback clock signal CLK_FB.

In operation S1640, the PLL circuit 100, 100A, or 100 may scale each of first and second sign values '+1' and '−1' of PHE_SIGN based on a fixed gain value and a variable gain value, respectively.

In operation S1650, the PLL circuit 100, 100A, or 100 may generate or adjust the reference voltage $V_{ref\_cal}$ based on the scaled two sign values.

The PLL circuit 100, 100A, or 100 may adjust the variable gain value such that an average of the two sign values of PHE_SIGN is zero when the PLL circuit 100, 100A, or 100 is locked. According to the above-described embodiments, fractional spurs of the PLL may be reduced. Accordingly, a PLL, a local oscillator, or an RFIC having improved performance may be provided.

As set forth above, according to example embodiments, fractional spurs of a PLL may be reduced. Accordingly, a PLL, a local oscillator, or an RFIC having improved performance may be provided.

While example embodiments have been shown and described above, it will be apparent to those skilled in the art that modifications and variations could be made without departing from the scope of the present inventive concept as defined by the appended claims.

What is claimed is:

1. A phase-locked loop (PLL) circuit comprising:
a voltage-controlled oscillator configured to generate an output clock signal of the PLL circuit;
a phase detector configured to generate a phase error signal representing a phase difference between a first clock signal based on a reference clock signal, and a second clock signal based on the output clock signal;
a comparator configured to generate a phase error sign signal based on a reference voltage and the phase error signal; and
a reference voltage generation circuit configured to scale first and second sign values of the phase error sign signal based on a fixed gain value and a variable gain value, respectively, and generate the reference voltage based on the scaled first and second sign values.

2. The PLL circuit of claim 1, wherein the reference voltage generation circuit adjusts the variable gain value such that an average value of the first and second sign values of the phase error sign signal is zero when the PLL circuit is in a locked state.

3. The PLL circuit of claim 1, wherein the reference voltage generation circuit comprises:
a scaling circuit configured to scale the two sign values of the phase error sign signal by the fixed gain value and the variable gain value, respectively;
a delta-sigma modulator configured to output a 2-bit signal based on the scaled two sign values; and
a digital-to-analog converter (DAC) configured to generate the reference voltage based on the 2-bit signal.

4. The PLL circuit of claim 3, wherein the DAC is a delta-voltage DAC comprising an output capacitor charged, held, or discharged by one step based on the 2-bit signal and configured to output the reference voltage.

5. The PLL circuit of claim 4, wherein:
the 2-bit signal comprises an up-signal to increase the reference voltage, a down-signal to decrease the reference voltage, and a hold signal to hold the reference voltage, and
up-current flowing through the output capacitor based on the up-signal and down-current flowing through the output capacitor based on the down-signal have different magnitudes.

6. The PLL circuit of claim 5, wherein:
the first sign value of the phase error sign signal corresponds to a positive number and the second sign value corresponds to a negative number, and
the delta-sigma modulator generates the 2-bit signal based on the first sign value scaled by the variable gain value and the second sign value scaled by the fixed gain value.

7. The PLL circuit of claim 5, wherein the reference voltage generation circuit increases the variable gain value when the down-current is larger than the up-current and decreases the variable gain value when the up-current is larger than the down-current.

8. The PLL circuit of claim 5, wherein:

the first sign value of the phase error sign signal corresponds to a positive number and the second sign value corresponds to a negative number, and the delta-sigma modulator generates the 2-bit signal based on the first sign value scaled by the fixed gain value and the second sign value scaled by the variable gain value.

9. The PLL circuit of claim 5, wherein the reference voltage generation circuit decreases the variable gain value when the down-current is larger than the up-current and increases the variable gain value when the up-current is larger than the down-current.

10. The PLL circuit of claim 1, wherein the reference voltage generation circuit adjusts the variable gain value based on an integral value of the phase error sign signal.

11. The PLL circuit of claim 3, wherein:

the scaling circuit comprises:

a multiplexer configured to output a first constant corresponding to the first sign value and a second constant corresponding to the second sign value based on two code values of the phase error sign signal;

an integrator configured to integrate an output of the multiplexer; and a quantizer configured to quantize the integral value of the integrator to generate the variable gain value, and the first and second constants have the same absolute value less than 1 but with opposite signs.

12. The PLL circuit of claim 1, comprising:

a digital-to-time converter (DTC) configured to delay the reference clock signal based on a DTC code;

a control code generation circuit configured to generate a division ratio code and the DTC code based on a frequency control word (FCW) and the phase error sign signal; and a divider configured to generate a feedback clock signal based on the division ratio code and the output clock signal, wherein, the first clock signal is the reference clock signal delayed by the DTC, and the second clock signal is the feedback clock signal.

13. The PLL circuit of claim 12, wherein the control code generation circuit comprises:

a delta-sigma modulator configured to generate the division ratio code based on the FCW;

an integrator configured to integrate a difference between the division ratio code and the FCW to generate a phase error code; and a DTC calibration circuit configured to generate the DTC code based on the phase error code and the phase error sign signal.

14. The PLL circuit of claim 13, wherein the DTC calibration circuit comprises a DTC nonlinearity calibration circuit configured to generate an offset value for calibrating nonlinearity of the DTC based on the phase error sign signal and the phase error code.

15. The PLL circuit of claim 13, wherein the DTC calibration circuit comprises a DTC gain calibration circuit configured to generate a DTC gain value for scaling the phase error code based on the phase error sign signal and the phase error code.

16. The PLL circuit of claim 12, wherein the phase error signal is a sampled voltage signal, and the PLL circuit further comprising:

a transconductance circuit configured to convert a difference between the phase error signal and a reference signal into a current signal; and a loop filter configured to convert the converted current signal into a voltage signal for controlling an operation of the voltage-controlled oscillator, wherein the reference voltage generation circuit generates the reference voltage such that a threshold voltage of the comparator tracks a threshold voltage of the transconductance circuit when the PLL circuit is in a locked state.

17. A phase error sign generator comprising:

a comparator configured to generate a phase error sign signal based on a reference voltage and a phase error signal; and a reference voltage generation circuit configured to scale first and second sign values of the phase error sign signal based on a fixed gain value and a variable gain value, respectively, and generate the reference voltage based on the scaled first and second sign values.

18. The phase error sign generator of claim 17, wherein the reference voltage generation circuit adjusts the variable gain value such that an average value of the first and second sign values of the phase error sign signal is zero.

19. The phase error sign generator of claim 17, wherein the phase error signal is an output signal of a sampling phase detector within a phase-locked loop (PLL).

20. A radio-frequency integrated circuit (RFIC) comprising:

a mixer; and a local oscillator configured to provide a reference frequency source to the mixer, wherein the local oscillator comprises:

a voltage-controlled oscillator configured to generate an output clock signal;

a phase detector configured to generate a phase error signal representing a phase difference between a first clock signal based on a reference clock signal and a second clock signal based on the output clock signal;

a comparator configured to generate a phase error sign signal based on a reference voltage and the phase error signal; and a reference voltage generation circuit configured to scale first and second sign values of the phase error sign signal based on a fixed gain value and a variable gain value, respectively, and generates the reference voltage based on the scaled first and second sign values.

* * * * *